United States Patent
Reznicek et al.

(10) Patent No.: US 10,510,829 B2
(45) Date of Patent: Dec. 17, 2019

(54) SECONDARY USE OF ASPECT RATIO TRAPPING TRENCHES AS RESISTOR STRUCTURES

(71) Applicant: International Business Machines Corporation, Armonk, NY (US)

(72) Inventors: Alexander Reznicek, Troy, NY (US); Chih-Chao Yang, Glenmont, NY (US); Praneet Adusumilli, Somerset, NJ (US); Oscar Van Der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/974,748

(22) Filed: May 9, 2018

(65) Prior Publication Data

US 2019/0348497 A1 Nov. 14, 2019

(51) Int. Cl.
*H01L 29/04* (2006.01)
*H01L 29/06* (2006.01)
*H01L 21/02* (2006.01)

(52) U.S. Cl.
CPC .......... *H01L 29/04* (2013.01); *H01L 21/0245* (2013.01); *H01L 21/02381* (2013.01); *H01L 21/02433* (2013.01); *H01L 21/02532* (2013.01); *H01L 21/02538* (2013.01); *H01L 21/02609* (2013.01); *H01L 21/02647* (2013.01); *H01L 29/0649* (2013.01)

(58) Field of Classification Search
CPC ......... H01L 21/02433; H01L 21/02381; H01L 21/02538; H01L 21/02647; H01L 21/02609; H01L 21/02532; H01L 21/0245; H01L 29/04; H01L 29/0649
See application file for complete search history.

(56) References Cited

U.S. PATENT DOCUMENTS

| | | |
|---|---|---|
| 9,263,453 B1 | 2/2016 | Cheng et al. |
| 2011/0049568 A1 | 3/2011 | Lochtefeld et al. |
| 2015/0123166 A1* | 5/2015 | Jacob ............... H01L 29/785 257/192 |

* cited by examiner

*Primary Examiner* — Jasmine J Clark
(74) *Attorney, Agent, or Firm* — Patterson + Sheridan, LLP

(57) ABSTRACT

A method for forming a semiconductor structure is disclosed. The method provides a substrate with an insulator pad overlying at least a top portion of the substrate. The method further includes forming a plurality of dielectric columns overlying the substrate and the dielectric pad. Each dielectric column is separated from another dielectric column to form a corresponding plurality of aspect-ration trapping (ART) trenches. The insulator pad spans a bottom portion of a first ART trench of the plurality of ART trenches. A portion of the substrate spans a bottom portion of a second ART trench of the plurality of ART trenches. The method further includes forming a III-V semiconductor material stack in the second ART trench. The method further includes forming a first resistive region in the first ART trench, wherein the first resistive region is in contact with the insulator pad.

25 Claims, 24 Drawing Sheets

SECONDARY USE OF ASPECT RATIO TRAPPING TRENCHES AS RESISTOR STRUCTURES

BACKGROUND

The present application relates to a semiconductor structure and a method of forming the same. More particularly, the present application relates to a method of providing resistors embedded in aspect ratio trapping structures (ART).

One way of improving the performance of CMOS devices is to utilize high mobility semiconductor channel materials. For example, III-V compound semiconductor materials have been touted for future technology nodes owning to their high carrier mobility. Unfortunately, dislocation defects typically arise in efforts to epitaxially grow one kind of crystalline material on a substrate of a different kind of material—often referred to as "heterostructure"—due to different crystalline lattice sizes of the two materials. This lattice mismatch between the starting substrate and subsequent layer(s) creates stress during material deposition that generates dislocation defects in the semiconductor structure.

Aspect ratio trapping (ART) is one way to overcome the lattice mismatch, however ART uses trenches or pillars with dielectric, i.e., oxide or nitride sidewalls, to grow the III-V epitaxy. Those dielectric regions consume area, which is contrary to the shrinking requirements of future smaller device nodes. Dielectric region not used for creating semiconductor device structures, such as transistors, are generally removed in the finished wafer.

Accordingly, what is needed, but has so far not been provided in the art, is to make use of unused ART structures formed using the ART process.

SUMMARY

According to one embodiment of the present invention, a method for forming a semiconductor structure includes providing a substrate with an insulator pad overlying at least a top portion of the substrate. The method further includes forming a plurality of dielectric columns overlying the substrate and the dielectric pad. Each dielectric column is separated from another dielectric column to form a corresponding plurality of aspect ratio trapping (ART) trenches. The insulator pad spans a bottom portion of a first ART trench of the plurality of ART trenches. A portion of the substrate spans a bottom portion of a second ART trench of the plurality of ART trenches. The method further includes forming a III-V semiconductor material stack in the second ART trench. The method further includes forming a first resistive region in the first ART trench, wherein the first resistive region is in contact with the insulator pad.

According to one embodiment of the present invention, a method for forming a semiconductor structure includes providing a substrate with an insulator pad overlying at least a top portion of the substrate. The method further includes forming a plurality of dielectric columns overlying the substrate and the dielectric pad. Each dielectric column is separated from another dielectric column to form a corresponding plurality of ART trenches. The method further includes forming a III-V semiconductor material stack in each of the plurality of ART trenches. The method further includes removing at least one III-V semiconductor material stack from at least one of the plurality of ART trenches to form an exposed ART trench. The method further includes forming an oxide layer overlying the substrate in the exposed ART trench. The method further includes forming a first resistive region in the exposed ART trench, wherein the first resistive region is in contact with the oxide layer.

According to one embodiment of the present invention, a method for forming a semiconductor structure includes a substrate. The semiconductor structure further includes an insulator pad formed overlying at least a portion of the substrate. The semiconductor structure further includes a plurality of dielectric columns formed overlying the substrate and the insulator pad. Each dielectric column is separated from another dielectric column to form a corresponding plurality of ART trenches. The insulator pad spans a bottom portion of a first ART trench of the plurality of ART trenches. A portion of the substrate spans a bottom portion of a second ART trench of the plurality of ART trenches. The semiconductor structure further includes a III-V semiconductor material stack formed in the second ART trench. The semiconductor structure further includes a first resistive region formed in the first ART trench, wherein the first resistive region is in contact with the insulator pad.

BRIEF DESCRIPTION OF THE SEVERAL VIEWS OF THE DRAWINGS

FIG. 22 is a cross-sectional side view of a semiconductor structure 2200 corresponding to the semiconductor structure 2100 of FIG. 21 after depositing an insulator material over the one or more resistive regions.

DETAILED DESCRIPTION

Figure 1:
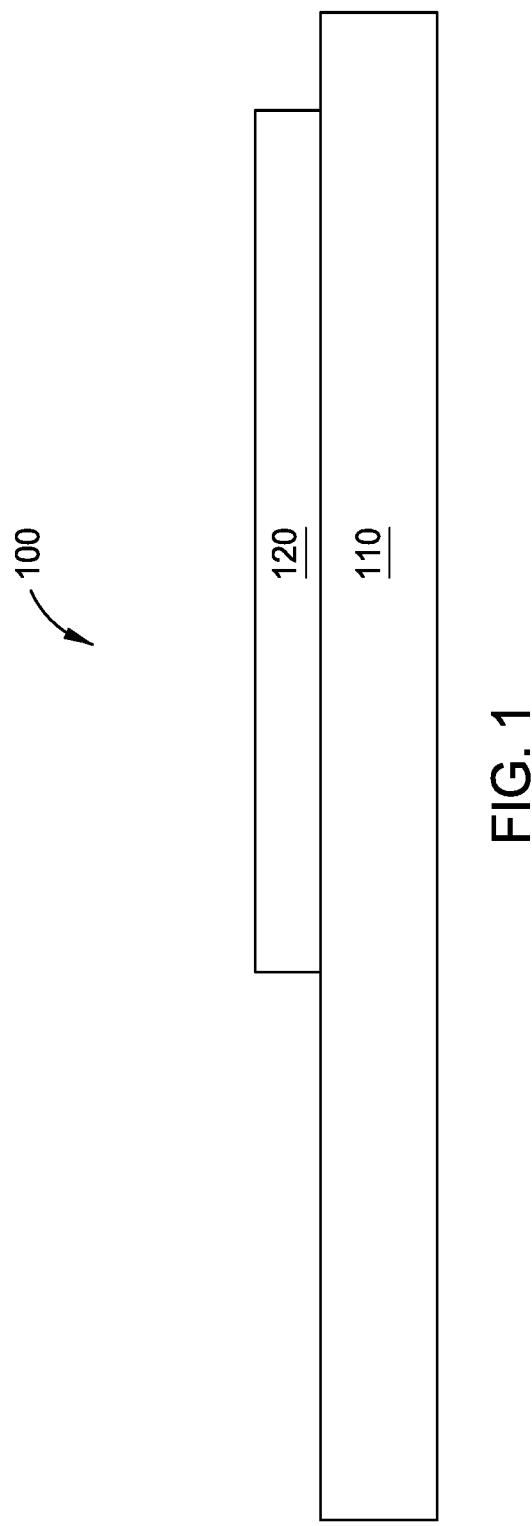
FIG. 1 is a cross-sectional view of an initial semiconductor structure that includes a substrate with an insulator pad thereon, which can be used in accordance with one or more embodiments of the present disclosure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application provides a semiconductor structure that can be used for co-integrating resistive structures with transistor structures on a single substrate. Since III-V co-integration is one of the technology options for future CMOS devices, and since III-V development and utilization can be improved with aspect ratio trapping methods (ART), co-integrating ART III-V structures, including techniques for streamlining co-integration, are advantageous. As noted above, overcoming the creation of large numbers of defects when integrating silicon with III-V materials can be alleviated by employing the aspect ratio trapping method (ART) to reduce defect levels to reasonable numbers to manufacture functioning devices.

Passive devices, such as resistors, are used in ART-based semiconductor devices. Since III-V devices can be created using aspect ratio trapping structures, ART trenches are already on a substrate. A secondary use for excess aspect ratio trapping trenches already formed on the substrate can be employed to create resistors needed for existing III-V semiconductor devices already created on the wafer. The resistors may be formed in trenches formed between ART insulating pillars overlying the substrate and shielded from the substrate by an oxide layer at the bottom of the trenches. The material type of the resistors and the placement of conductive contacts to portions of the resistors define resistive values. The resistive values are also defined by the ART trench width.

FIG. 1 is a cross-sectional view of an initial semiconductor structure 100 that includes a substrate 110 with an insulator pad 120 thereon, which can be used in accordance with one or more embodiments of the present disclosure. Any suitable technique can be used to provide the substrate 110 and the insulator pad 120. The semiconductor substrate 110 may be composed of a silicon containing material such as Si, single crystal Si, SiGe, single crystal silicon germanium, and combinations and multi-layers thereof. The semiconductor substrate 110 may also be composed of other semiconductor materials, such as germanium, and compound semiconductor substrates, such as type III/V (III-V) semiconductor substrates, including gallium arsenide (GaAs), indium phosphide (InP) and indium gallium arsenide (InGaAs), where in at least one embodiment the substrate is used, in accordance with aspect-ratio trapping techniques, to form one or more structures as disclosed herein. Although the semiconductor substrate 110 is depicted as a bulk semiconductor substrate, semiconductor on insulator (SOI) substrate arrangements, such as silicon on insulator substrates, are also suitable for the semiconductor substrate 110. In one embodiment, the insulator pad 120 can be a nitride or oxide pad.

The insulator pad 120 can be deposited on the substrate 110 using any suitable masking and depositing technique. Suitable techniques can include chemical vapor deposition (CVD) or plasma enhanced chemical vapor deposition (PECVD). In other embodiments, the insulator pad 120 can be formed by a thermal process such as, for example, thermal oxidation and/or thermal nitridation. In yet other embodiments, the insulator pad 120 can be formed by a combination of a deposition process and a thermal process. The thickness of the insulator pad 120 can range from 2 nm to 10 nm, with a thickness from 3 nm to 6 nm being more typical. The width of the insulator pad 120 may extend a width of one or more resistors to be formed in ART trenches for the purpose of preventing the resistors to be formed in the ART trenches from contacting the semiconductor substrate 110.

Figure 2:
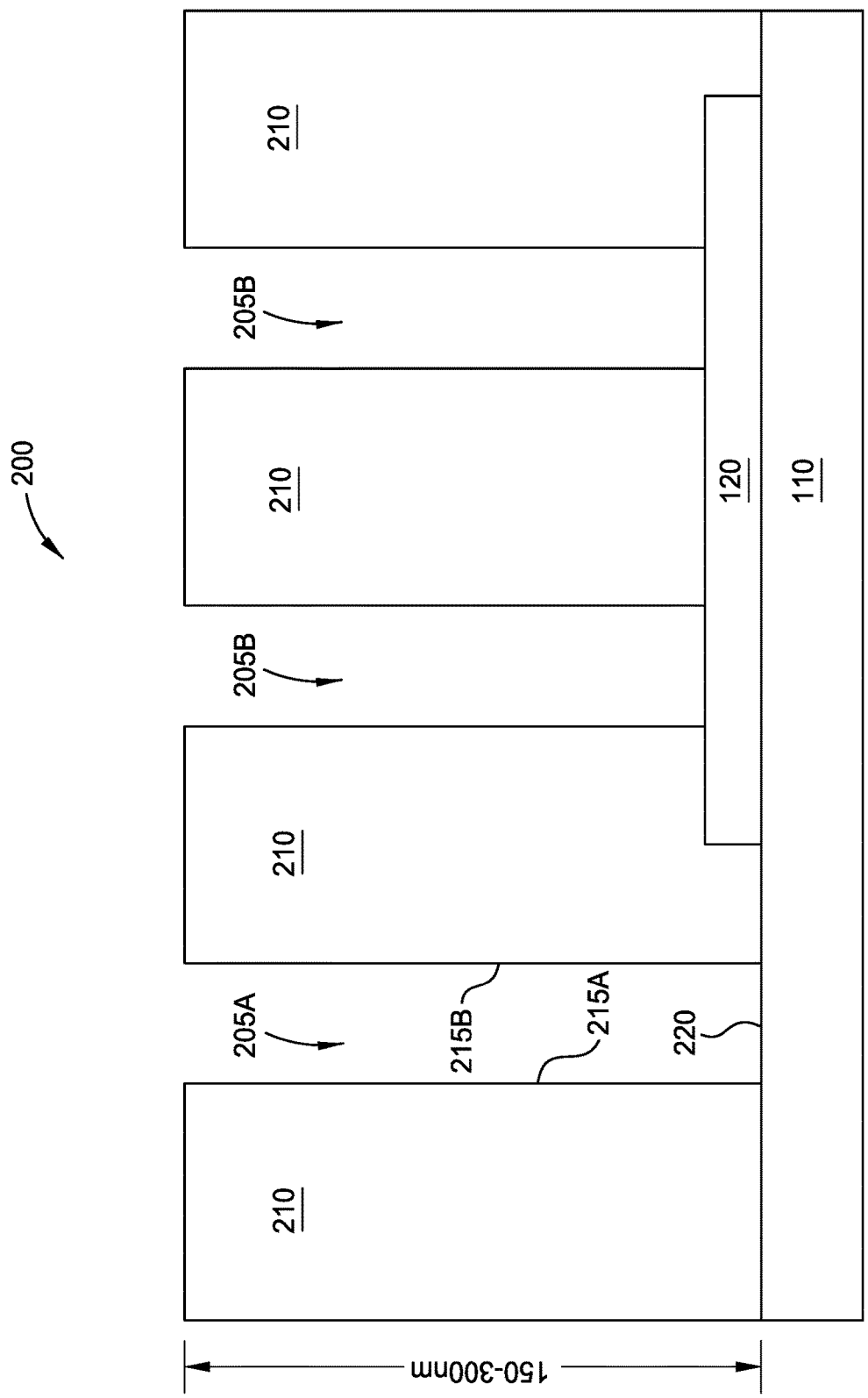
FIG. 2 is a cross-sectional side view of a semiconductor structure corresponding to the semiconductor structure of FIG. 1 after formation of an aspect-ratio trapping structure suitable for material deposition.

FIG. 2 is a cross-sectional side view of a semiconductor structure 200 corresponding to the semiconductor structure 100 of FIG. 1 after forming an aspect-ratio trapping structures suitable for material deposition in accordance with one or more embodiments of the present disclosure. The semiconductor structure 200 includes one or more exposed ART trenches 205A and one or more trenches 205B associated with the insulator pad 120 (referred to herein for convenience as a dielectric or insulator trench 205B or dielectric or insulator opening 205B). The ART trench 205A is suitable for epitaxial deposition, including heteroepitaxial deposition, of a material stack 310 (see FIG. 3) that includes one or more III-V materials, where in a general sense, the ART processes refers to any suitable practice and technique for confining defects, such as dislocation defects, that arise as a result of lattice-mismatches between material grown on a particular surface and the surface on which the growth takes place (for example, due to lattice-constant mismatches between the deposited material and the substrate material). The one or more dielectric trenches 205B enable deposition of resistive material in a manner that electrically isolates the deposited resistive material as the material will be in contact with the nitride pad 120.

The semiconductor structure 200 further includes one or more dielectric columns 210 where the one or more dielectric columns 210 form the basis for the ART process and also forms the basis for the trenches 205A, 205B. The dielectric columns 210 have sidewalls 215A, 215B that define, along with bottom surface 220 terminating on the substrate 110 or on the nitride pad 120, the trenches 205A, 205B. The dielectric columns 210 may have a height typically in the range of 310 nm to 300 nm. The dielectric columns 210 may have a width typically in the range of 25 nm to 60 nm. The trenches 205A, 205B between the dielectric columns 210 may have a width in the range of 8 nm to 20 nm.

The dielectric columns 210 can be formed using know deposition techniques, e.g. (CVD), or variations thereof, followed by suitable photo-lithographic and masking techniques that are consistent with ART processes. In one embodiment, the substrate 110 is a silicon based substrate 110, the insulator pad 120 is a nitride pad 120, and the one or more dielectric columns 210 are oxide dielectric columns 210.

Figure 3:
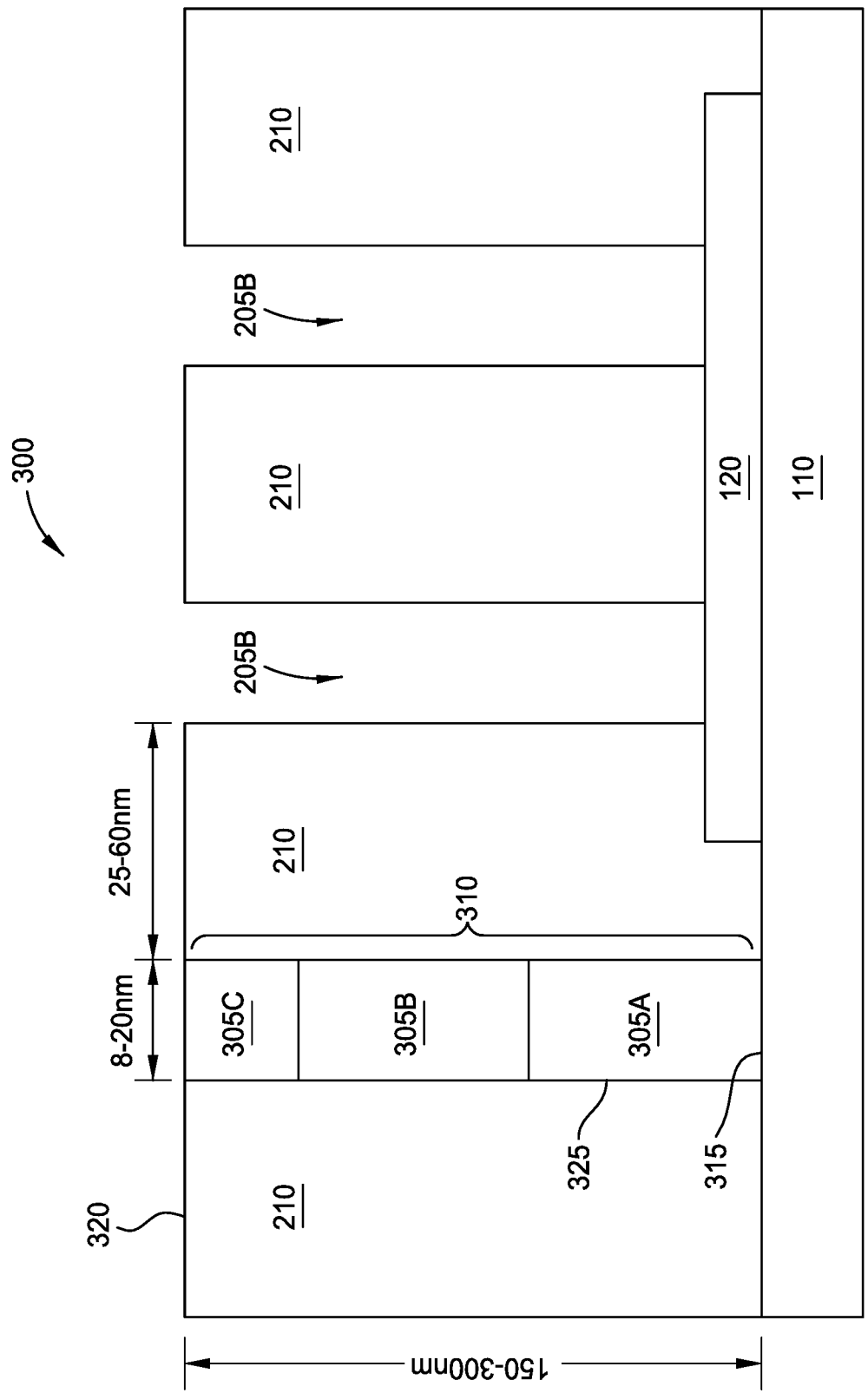
FIG. 3 is a cross-sectional side view of a semiconductor structure corresponding to the semiconductor structure of FIG. 2 after epitaxially growing at least one III-V material stack in a trench.

FIG. 3 is a cross-sectional side view of a semiconductor structure 300 corresponding to the semiconductor structure 200 of FIG. 2 after epitaxially growing at least one III-V material stack 310 in the trench 205A. The epitaxial deposition can occur such that a heteroepitaxial region grows over the disposed silicon substrate 110. The material stack 310 includes a first region 305A made of a first III-V semiconductor material forming the bottom layer of the material stack 310, a second region 305B overlying the first region 305A made of a second III-V material forming a middle layer of the material stack 310, and a third region 305C made of a third III-V material overlying the second region 305B.

Exemplary III-V semiconductor materials that can be used for the regions 305A, 305B, 305C the material stack 310 include but are not limited to gallium arsenide (GaAs), indium phosphide (InP), and indium gallium arsenide (InGaAs). Various processes are familiar to those of skilled in the art for growing III-V semiconductor materials on silicon substrates. Such processes include metalorganic chemical vapor deposition (MOCVD) and molecular beam epitaxy (MBE). Many different III-V compounds could be grown on the substrate 110 using multiple different precursors. Depending on which III-V material(s) is to be grown and which precursor is used, different parameters (temperature, process pressure, times, etc.) are applicable. Non-limiting examples of metalorganic prescursors include Trimethylgallium, Trimethylaluminum, Trimethylindium, Trimethylantimony, Tertiarybutylarsine and Tertiarybutylphosphine. Alternate Group V precursors include arsine and phosphine. In one embodiment, the material stack 310 includes at least one of indium gallium arsenide (InGaAs) and indium-phosphide (InP). Depending on which Group V source is used, process temperature, gas flow, pressure and times can vary significantly in accordance with aspect-ratio trapping techniques know in the art or separately described herein. In one embodiment, as shown, the epitaxial process is adjusted such that more than one III-V material 305A, 305B, and 305C constitutes the material stack 310, where the first region 305A is a GaAs layer, the second region 305B is an InP layer, and the third region 305C is an InGaAs layer.

In a typical ART stack forming process, the GaAs layer is grown in the region 305A in the trench 205A from the substrate 110 up to at least a minimum height H1. Gallium arsenide has a lattice constant that is larger than that of the underlying silicon substrate 110. Defects initially form overlying the bottom surface 315 of the trench 205A near the silicon substrate 110. Defects in the epitaxial growth of the GaAs first region 305A decrease substantially moving in a direction up the trench 205A away from the bottom surface 220 of the trench 205A until there are substantially no defects formed above the minimum height H1, which is less than a height H2 of the first region 305A. This is due to defects in the GaAs layer 305A having formation angles of about 45 degrees to 60 degrees cancelling out along the sidewalls 325 of the trench 205A. The InP layer of the region 305B has a lattice constant that still larger than but closer to the lattice constant of GaAs is deposited overlying the GaAs first region 305A from the height H2 to a height H4 that is greater than a second minimum height H3 above which substantially no defects are. The InGaAs layer of the region 305C having a lattice constant that is the same as the lattice constant of the InP layer of the region 305B, is deposited overlying the InP second layer of the region 305B in the trench 205A to at least a top surface 320 of the one or more dielectric columns 215 such that the entirety of the region 305A is defect free. Thus, any adverse effects stemming from crystalline defects are mitigated by the ART trench 205A and the ART process in general. A lateral overgrowth of the III-V material stack 310 can occur over the top surface 320 of one or more of the one or more dielectric columns 215, and CMP can be applied discretely on any heteroepitaxial overgrowth that can expand therefrom. This is merely one particular practice of filling and developing an opening with aspect-ratio trapping techniques in accordance with the present specification, and those skilled in the art will appreciate that alternative methods can be applied both to develop and fill the trench 205A.

Figure 4:
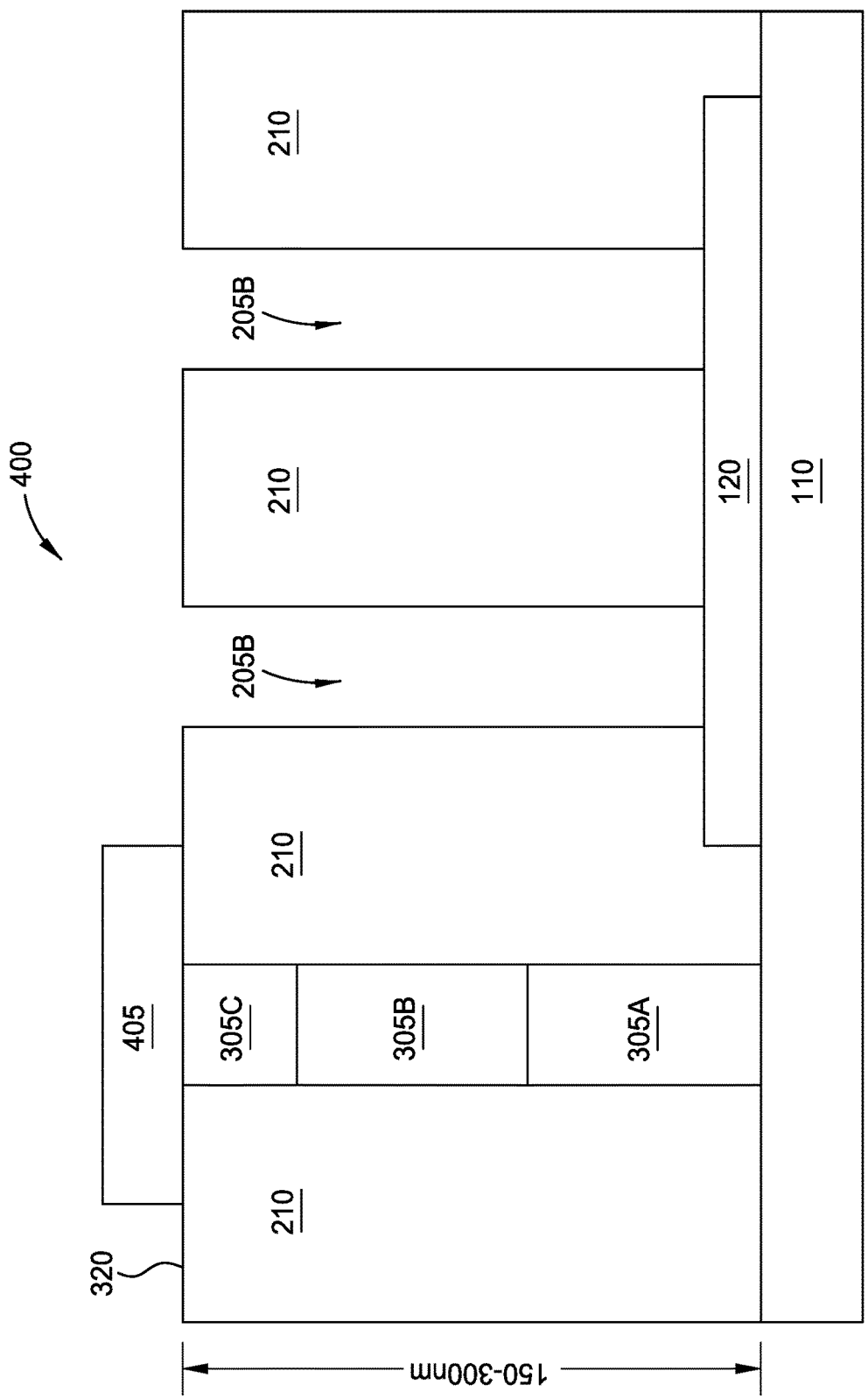
FIG. 4 is a cross-sectional side view of a semiconductor structure corresponding to the semiconductor structure of FIG. 3 after depositing a hard mask over a III-V material stack and subsequently cleaning exposed trenches.

FIG. 4 is a cross-sectional side view of a semiconductor structure 400 corresponding to the semiconductor structure 300 of FIG. 3 after depositing a hard mask 405 over the III-V material stack 310 and subsequently cleaning the exposed trenches 205B. The nitride pad 120 prevents substantial growth of III-V material during the epitaxial process used to form stack 210; however, residual III-V material (not shown) can be deposited in the trenches 205B. In order to remove the residual material without compromising the stack 210, a hard mask 405 is deposited over the stack 210 using any suitable hard mask deposition technique. The hard mask 405 can be a nitride, oxide, or other suitable material. After deposition of the hard mask 405, the residual material in the trenches 205B can be removed using a wet etch technique, such as a timed wet etch step. Each of the semiconductor materials of first region 305A, the second region 305B, and the third region 305C three semiconductors requires its own wet etch. The wet etch of the GaAs of the first region 305A and the InP of the second region 305B may be a combination of HCl and $H_2O_2$. The InP second region 305B and the InGaAs region 305C may be wet etched with $H_2SO_4$:$H_2O_2$:H2O and $H_2SO_4$:$H_2O_2$:HF. The latter combination of wet etch materials may be applied to any residual material contacting sidewalls of the dielectric layers 205B that form the one or more trenches 205B and to the exposed surface of the nitride pad 120.

Figure 5:
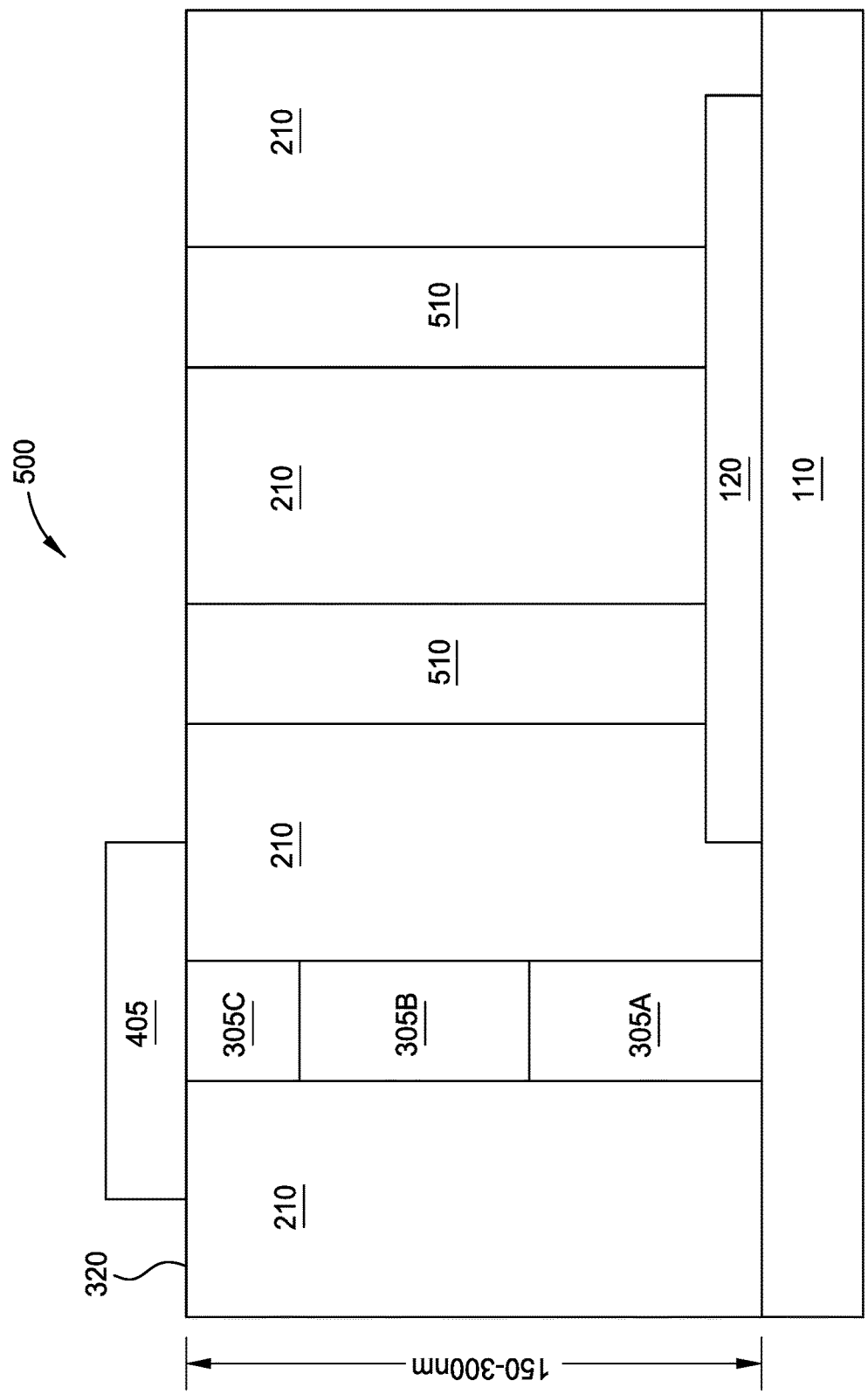
FIG. 5 is a cross-sectional side view of a semiconductor structure corresponding to the semiconductor structure of FIG. 4 after depositing at least one resistive material in one or more of the trenches.

FIG. 5 is a cross-sectional side view of a semiconductor structure 500 corresponding to the semiconductor structure 400 of FIG. 4 after depositing at least one resistive material in one or more of the trenches 205B to form one or more resistive regions 510. Using any suitable deposition technique, including CVD, e.g. PECVD, the trenches 205 are filled with one or more resistive materials including but not limited to doped poly silicon (poly-Si), tantalum nitride, (TaN), titanium nitride (TiN), alloyed titanium nitride, titanium silicon nitride (TiSiN), tungsten nitride (WN),), titanium carbide (TiC), tantalum carbide (TaC), tungsten carbide (WC), hafnium carbide (HfC), hafnium nitride (HfN), titanium aluminum carbide (TiAlC), or combinations thereof. The nitride pad 120 insulates the one or more resistive regions 510 from other portions of structure 500.

Figure 6:
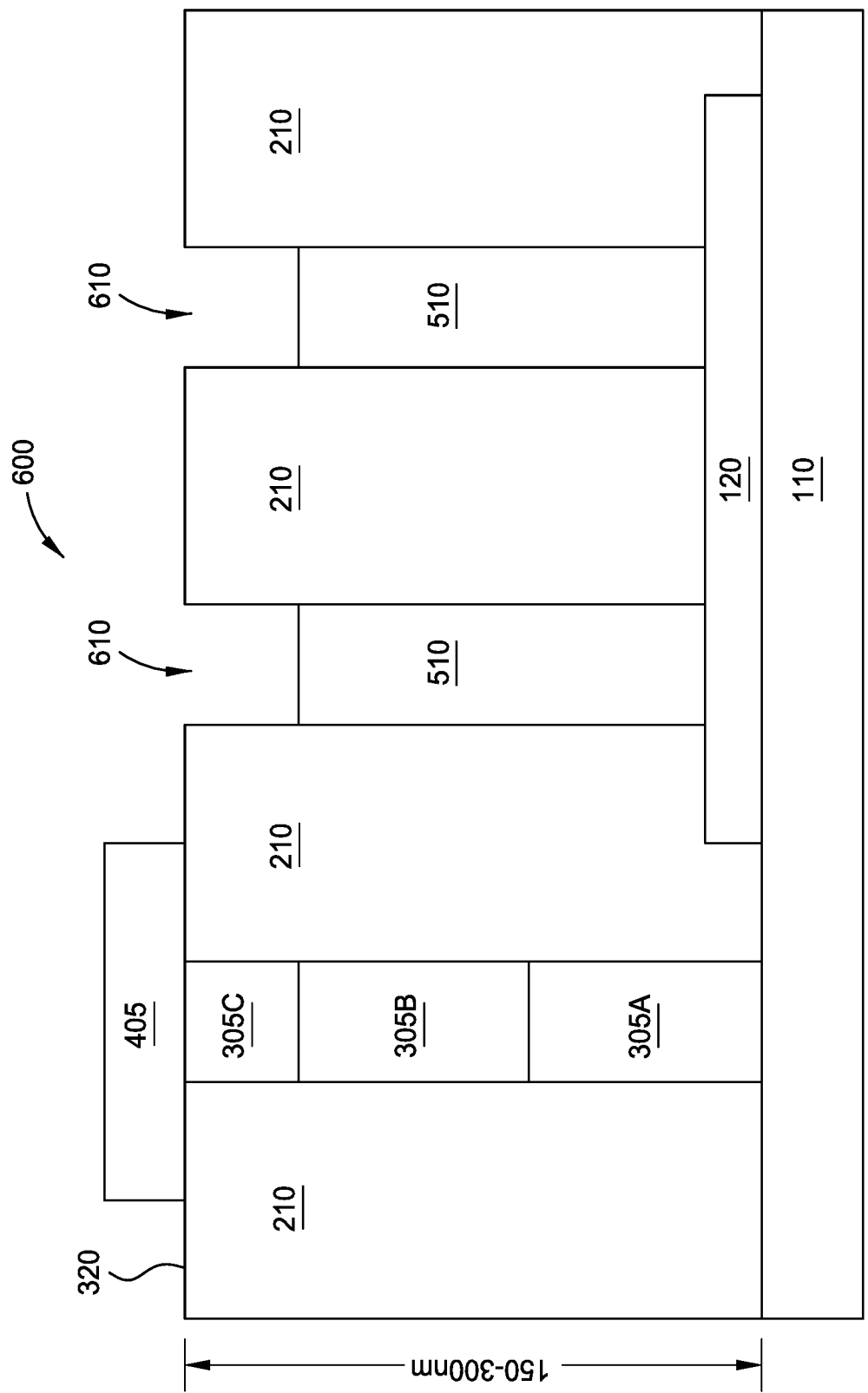
FIG. 6 is a cross-sectional side view of a semiconductor structure corresponding to the semiconductor structure of FIG. 5 after recessing a portion of one or more of the resistive materials.

FIG. 6 is a cross-sectional side view of a semiconductor structure 600 corresponding to the semiconductor structure 500 of FIG. 5 after recessing a portion 610 of one or more of the resistive regions 510. The recessing can be accomplished using any suitable etching technique, including but not limited to RIE.

Figure 7:
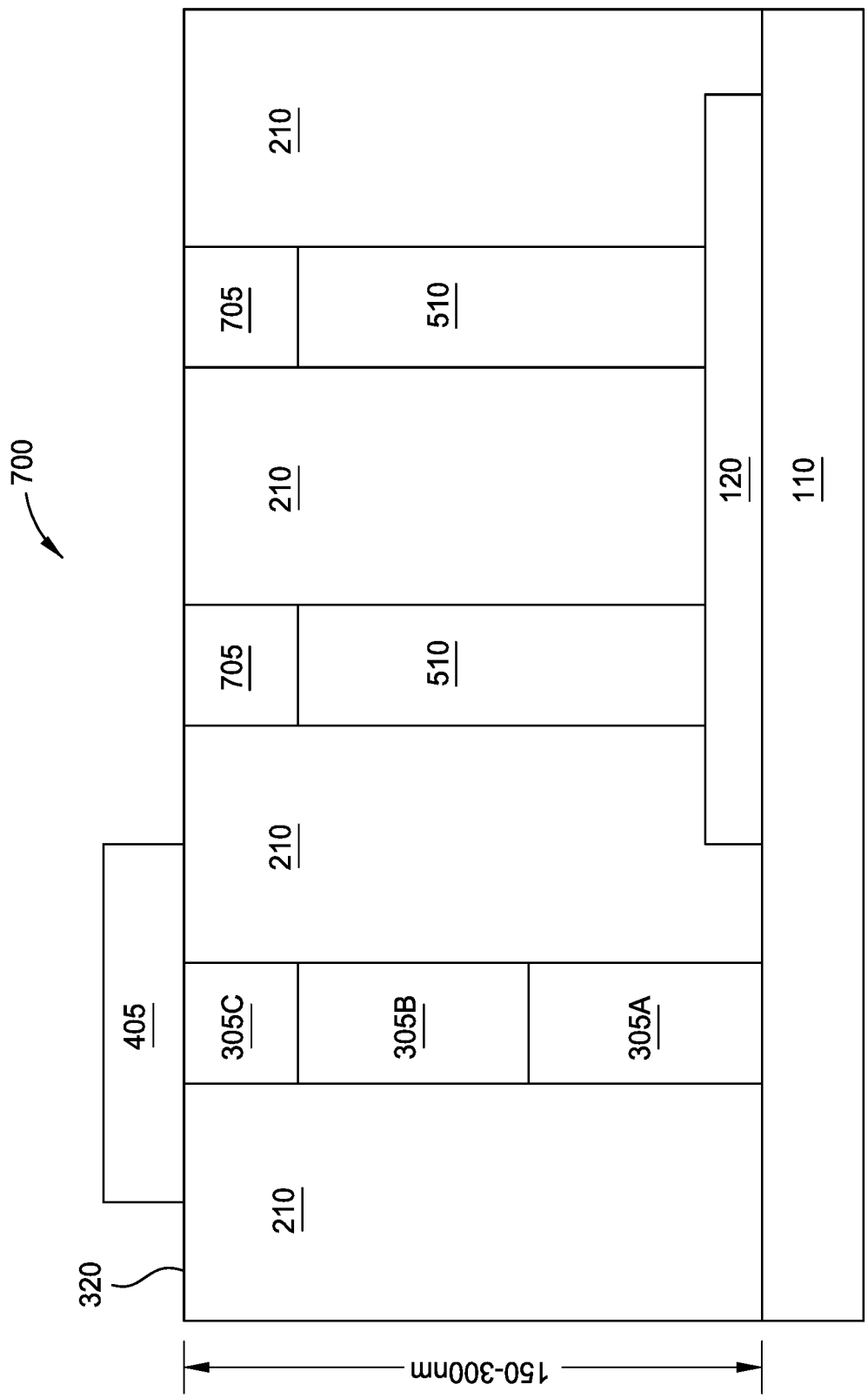
FIG. 7 is a cross-sectional side view of a semiconductor structure corresponding to the semiconductor structure of FIG. 6 after depositing an insulator material over the one or more resistive materials.

FIG. 7 is a cross-sectional side view of a semiconductor structure 700 corresponding to the semiconductor structure 600 of FIG. 6 after depositing an insulator material 705 over the one or more resistive regions 510. The insulator material 705 may be deposited using any suitable deposition technique, e.g. CVD. In one embodiment, the insulator material 705 is an oxide based material.

Figure 8:
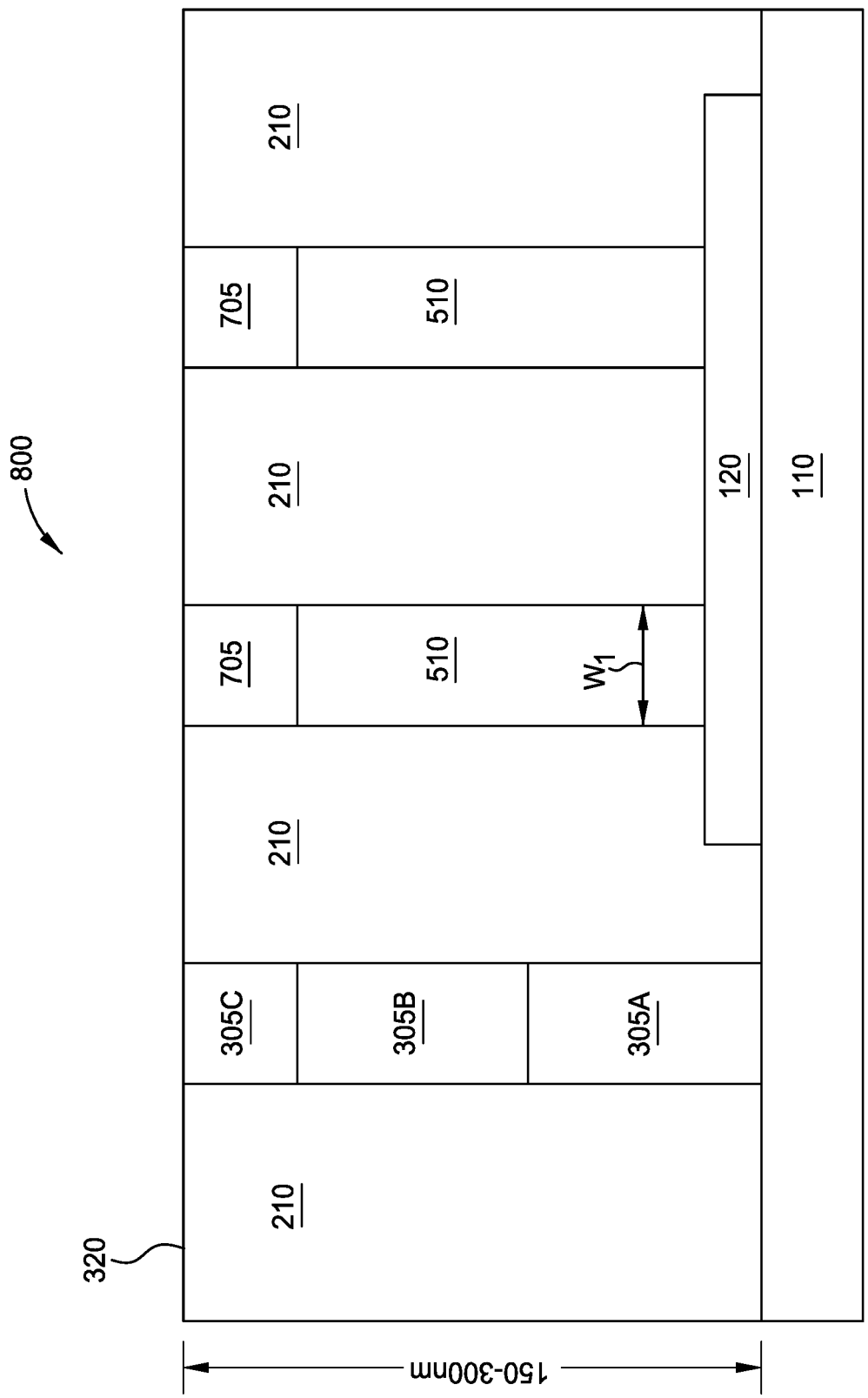
FIG. 8 is a cross-sectional side view of a semiconductor structure corresponding to the semiconductor structure of FIG. 7 after removing the hard mask.

FIG. 8 is a cross-sectional side view of a semiconductor structure 800 corresponding to the semiconductor structure 700 of FIG. 7 after removing the hard mask 405. The hard mask 405 may be removed using a suitable etching technique selective to the material that makes up the hard mask 405, e.g. nitride, including but not limited to RIE.

Figure 9:
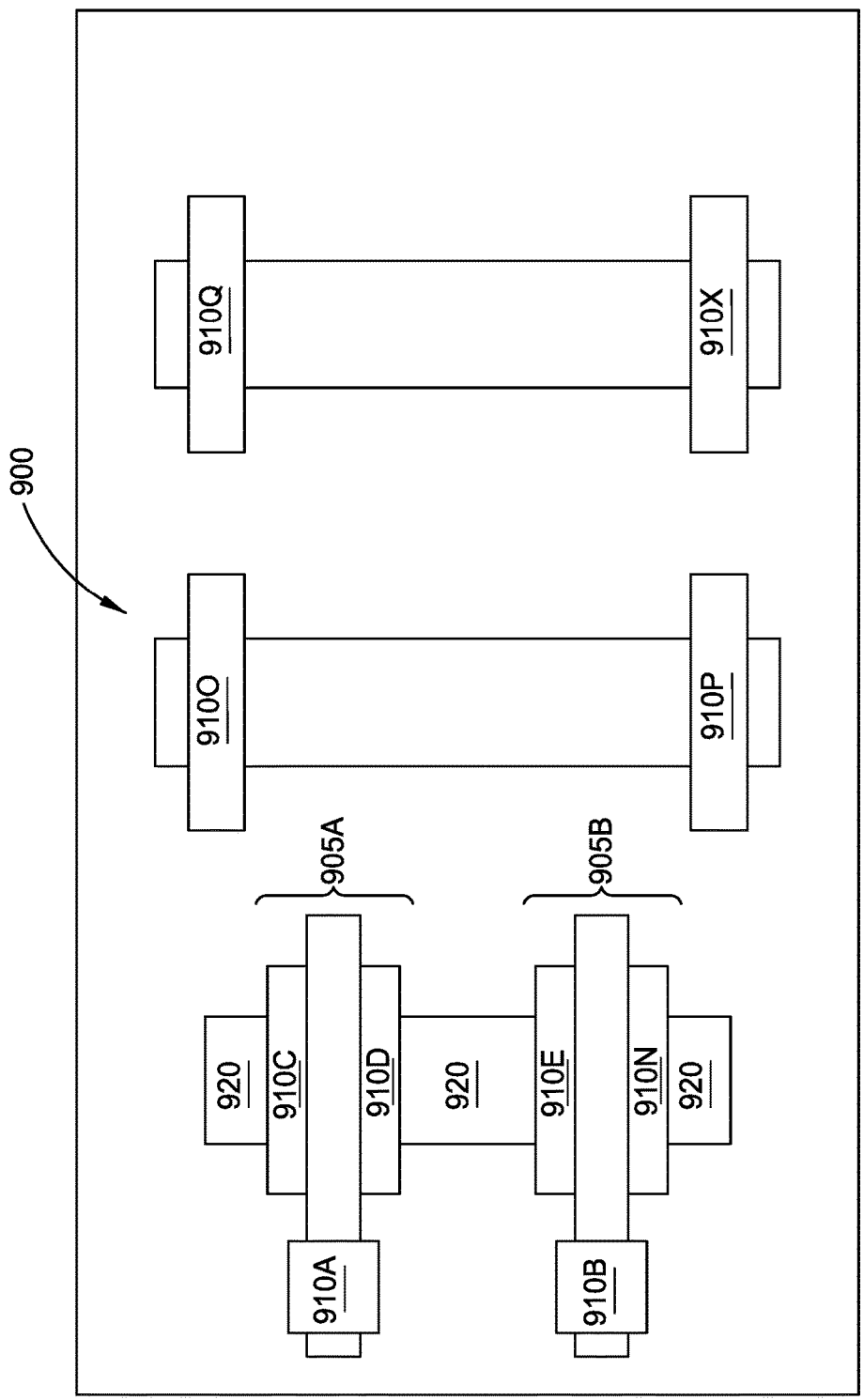
FIG. 9 is a top down view of a semiconductor structure corresponding to the semiconductor structure of FIG. 8 after forming a plurality of III-V compound semiconductor transistor devices overlying the material stack.

FIG. 9 is a top down view of a semiconductor structure 900 corresponding to the semiconductor structure 800 of FIG. 8 after forming a plurality of III-V compound semiconductor transistor devices 905A, 905B overlying the material stack 310 in each of the trenches 205A and forming contacts 910A-910N to individual sections of the devices 905A, 905B, as well as forming contacts 9100-910X overlying the one or more of the resistive regions 510 underlying the insulator material 705. The transistor devices 905A, 905B can include gate structures 915 having gate contacts 910A, 910B formed thereon. The transistor devices 905A, 905B can further include gate source/drain regions (not shown) having source/drain contacts (S/D) 910C-910N formed thereon. The transistor devices 905A, 905B are separated from each other by shallow trench insolation (STI) regions 920 formed thereon.

The value of the resistance of the resistance of the resistive regions 510 can be determined by several parameter including the height of the resistive regions 510 in the trenches 205B, the width of the resistive regions 510 in the trenches 205B, the composition of the resistive material itself, the spacing of the contacts 9100-910X overlying the resistive regions 510, the number of resistive regions 510 spanned by single contacts, and other parameters to be discussed hereinbelow in connection with FIGS. 10-14.

Figure 10:
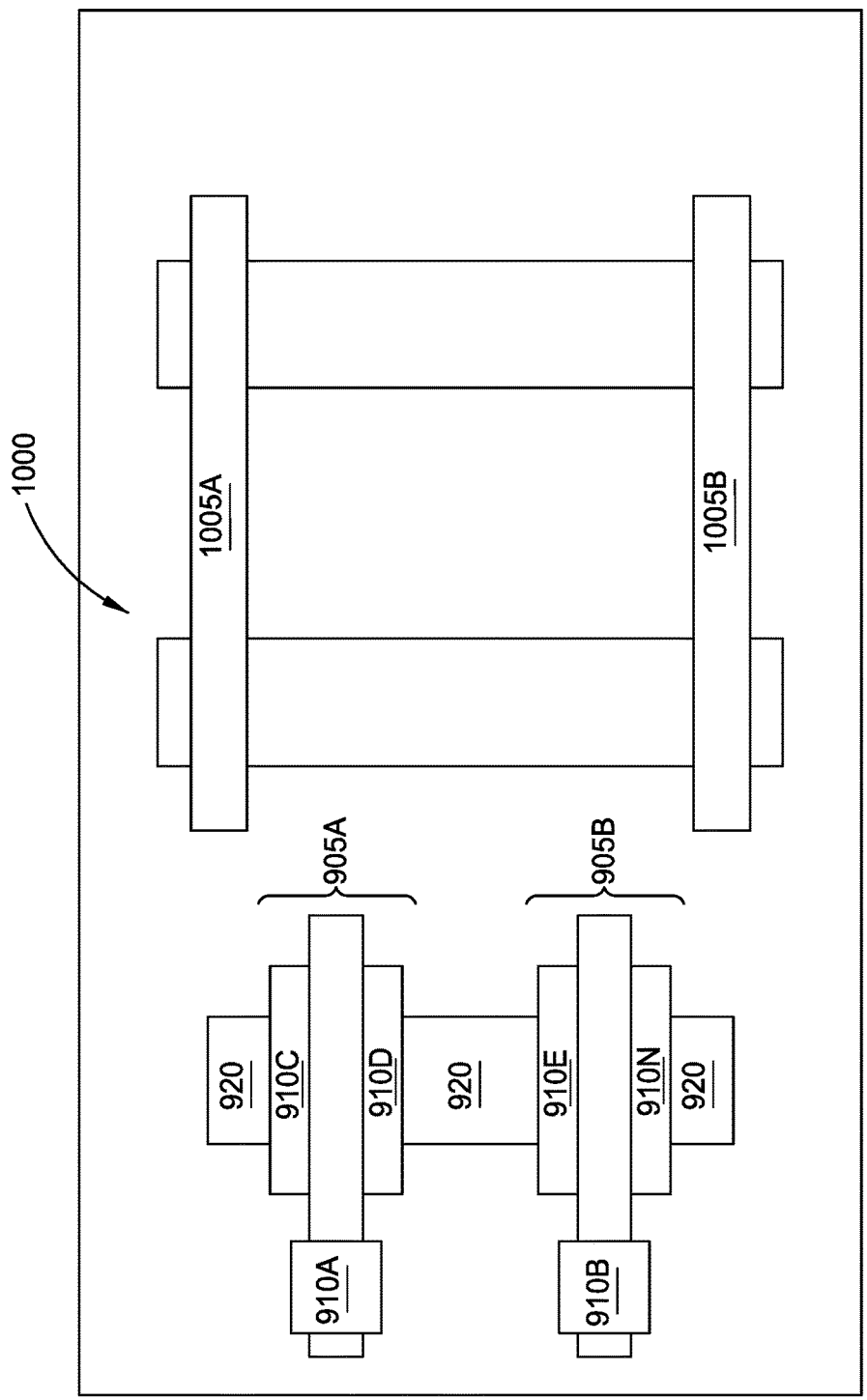
FIG. 10 is a top down view of a semiconductor structure corresponding to the semiconductor structure of FIG. 9 after varying the number of resistive regions over which contact span to create resistances of various values of resistance in the resistive regions.

FIG. 10 is a top down view of a semiconductor structure 1000 corresponding to the semiconductor structure 900 of FIG. 9 after varying the number of resistive regions 510 over which contact 1005A, 1005B span to create resistances of various values of resistance in the resistive regions 510. As previous noted, the contacts 1005A, 1005B can span from one to a plurality of resistive regions 510 to form resistances that are in any combination of parallel and/or series structures to create resistive networks. In another example, the spacing of the contacts 9100-910X, 1005A, 1005B can be moved closer together for small values of total resistance and further apart for larger values of total resistance.

Figure 11:
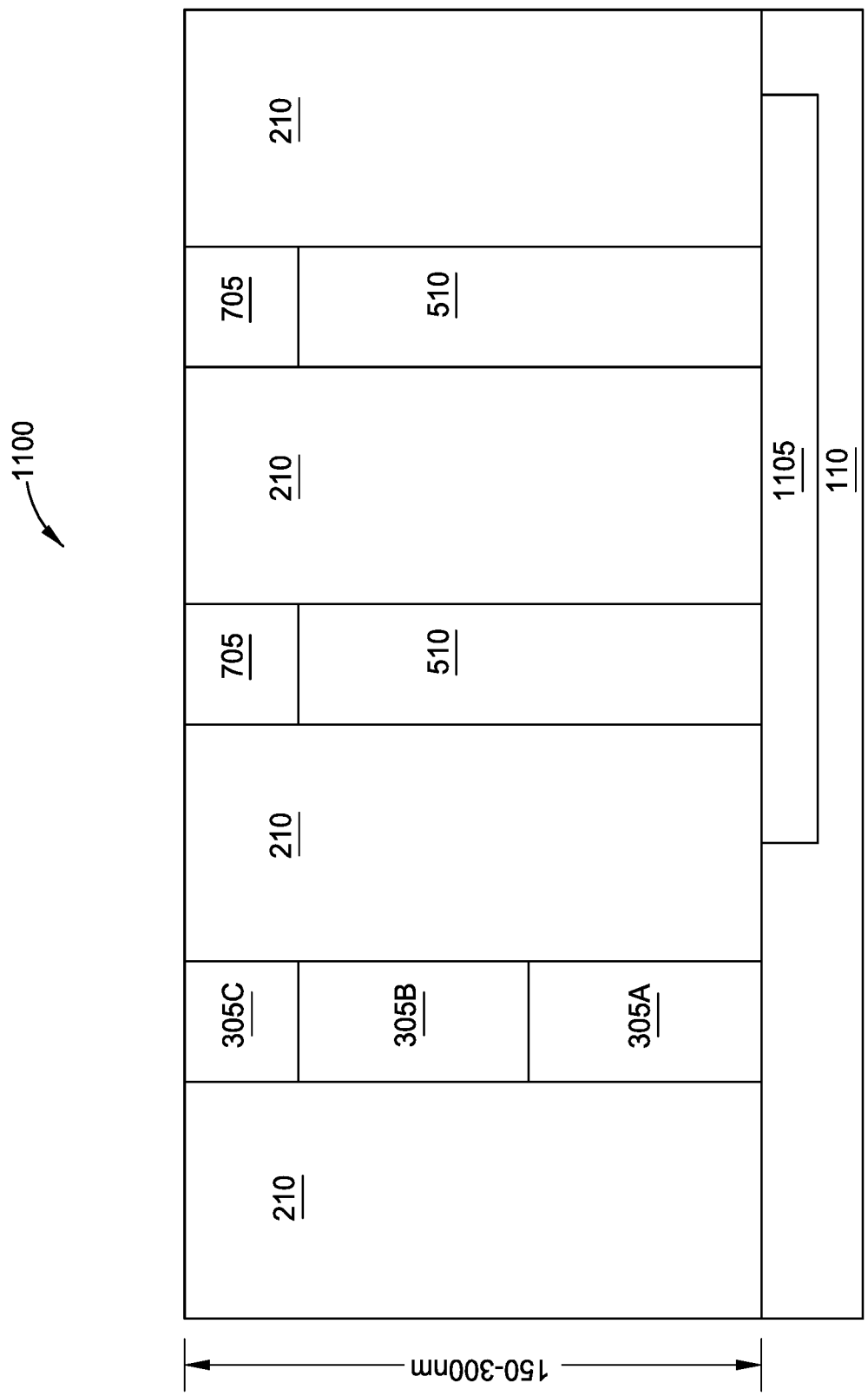
FIG. 11 illustrates a modification of a substrate and insulator pad configuration for at least one embodiment of the present disclosure.

FIG. 11 illustrates a modification of the substrate 110 and insulator pad 120 configuration for at least one embodiment of the present disclosure, which can ultimately result in structure 1100 after one or more techniques of the present disclosure are applied thereto. In this embodiment, the insulator pad 1105 is embedded in the substrate 110, which can be accomplished by any suitable masking, etching, deposition, and CMP technique(s). Otherwise, pursuant to this embodiment, the above process steps can be carried out, resulting in structure 1100, which includes a III-V material stack 310 in an ART trench and a deposited resistive region 510 in another trench associated with the structure 1100. The embedded insulator pad 1105 offers an advantage when adjusting dimensional characteristics of the one or more resistive regions 510, which adjusts an overall resistance value (e.g. resistance is a function of dimensional characteristics), as it enables for a more uniform orientation with respect to the one or more resistive regions 510 in relation to each other and/or other components because of the planar surface of the embedded insulator pad 1105. The embedded insulator pad 1105 can be a nitride or oxide pad 1105. In one embodiment, the embedded pad 1105 is a nitride pad 1105 and the substrate 110 is a Si substrate.

Figure 12:
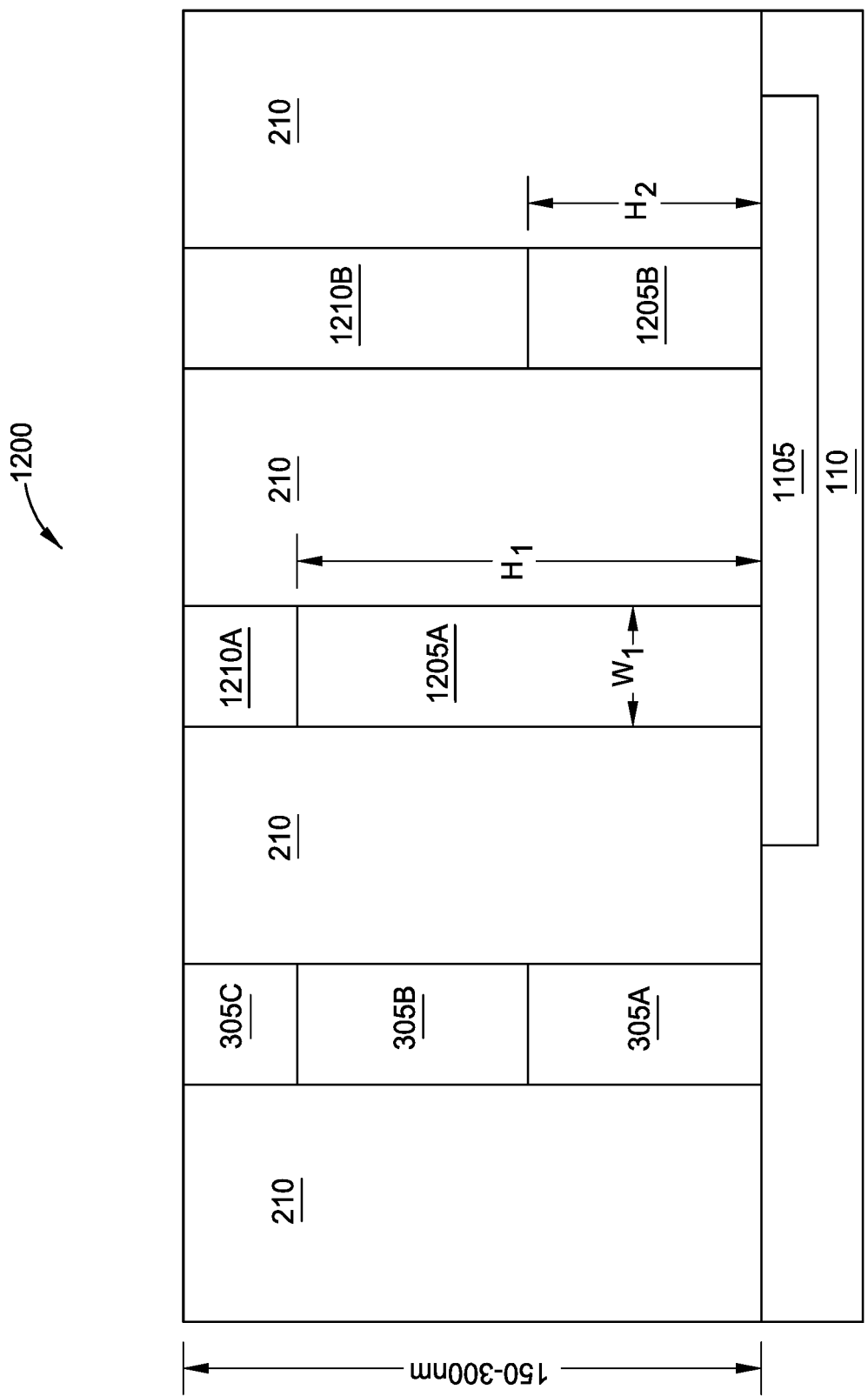
FIG. 12 illustrates an embodiment for setting or adjusting a resistance value associated with a resistive material by adjusting or altering high value associated therewith.

FIG. 12 illustrates an embodiment for setting or adjusting a resistance value associated with a resistive material by adjusting or altering high value associated therewith, resulting in structure 1200. According to one embodiment, as shown, after depositing one or more resistive materials, e.g. 1205A, 1205B as described above, a recess process can be performed on the one or more resistive regions 1205A, 1205B, as described with respect to one or more other embodiments of the present disclosure. The recess process can recess one of the one or more resistive regions 1205B, more than another one of the one or more resistive regions 1205A, in order to adjust the overall resistance value in relation thereto (e.g., as stated, since resistance value is at least partly a function of dimensional characteristics). Thereafter, an insulator material 1210A e.g. oxide, of one dimensional size along a recessed direction of the one or more resistive regions 1205A is deposited over resistive region 1205A and a different insulator material 1210B e.g. oxide, of a different dimensional size along a recessed direction of the one or more resistive regions 1205B. According to this embodiment, a same resistive material can be used for both 1205A and 1205B, but the overall resistance of each structure can be different as a result of the dimensional modification.

Figure 13:
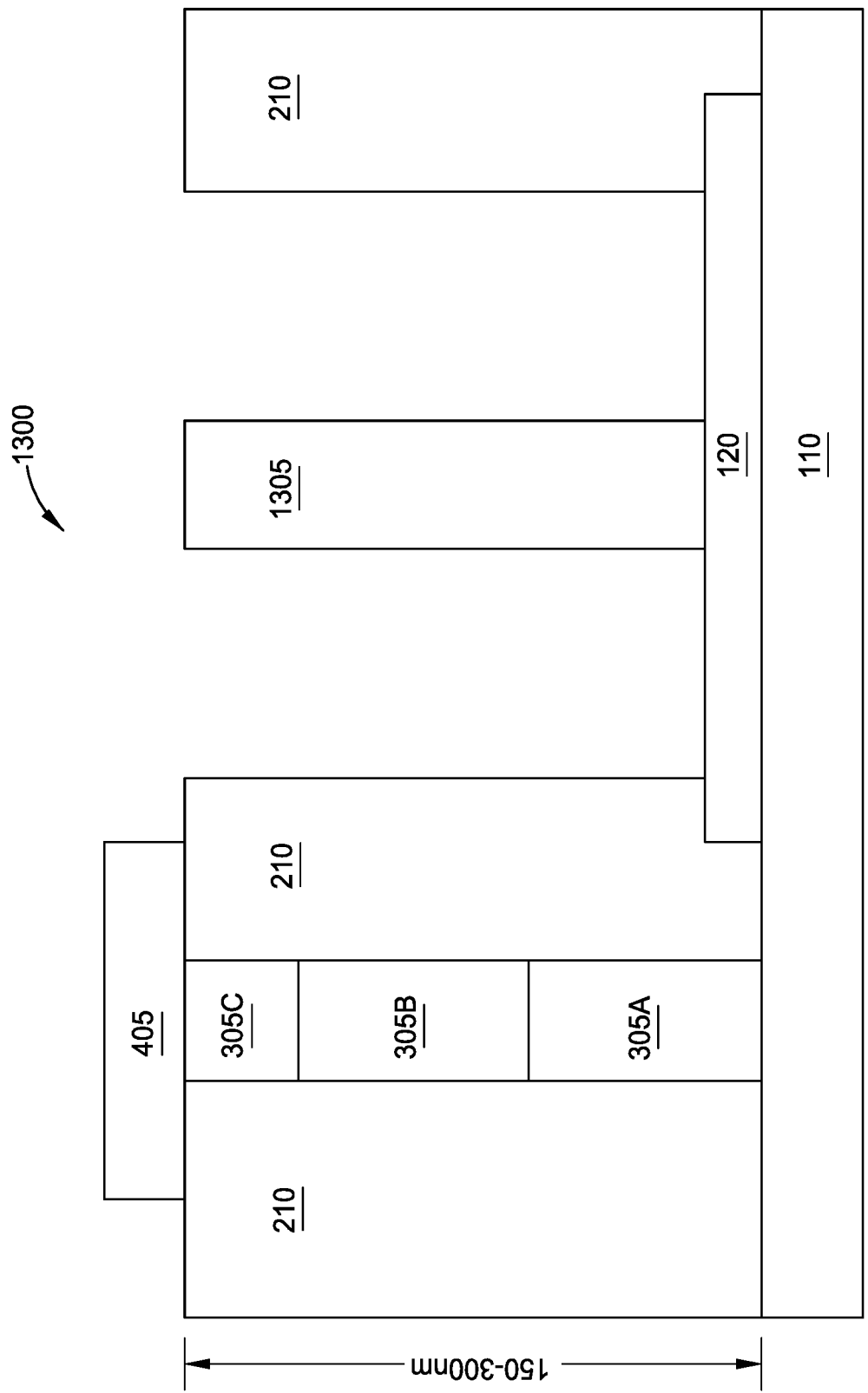
FIGS. 13 and 14 illustrate an embodiment for setting or adjusting a resistance value associated with a resistive material by adjusting or altering a dimensional characteristic associated therewith.
Figure 14:
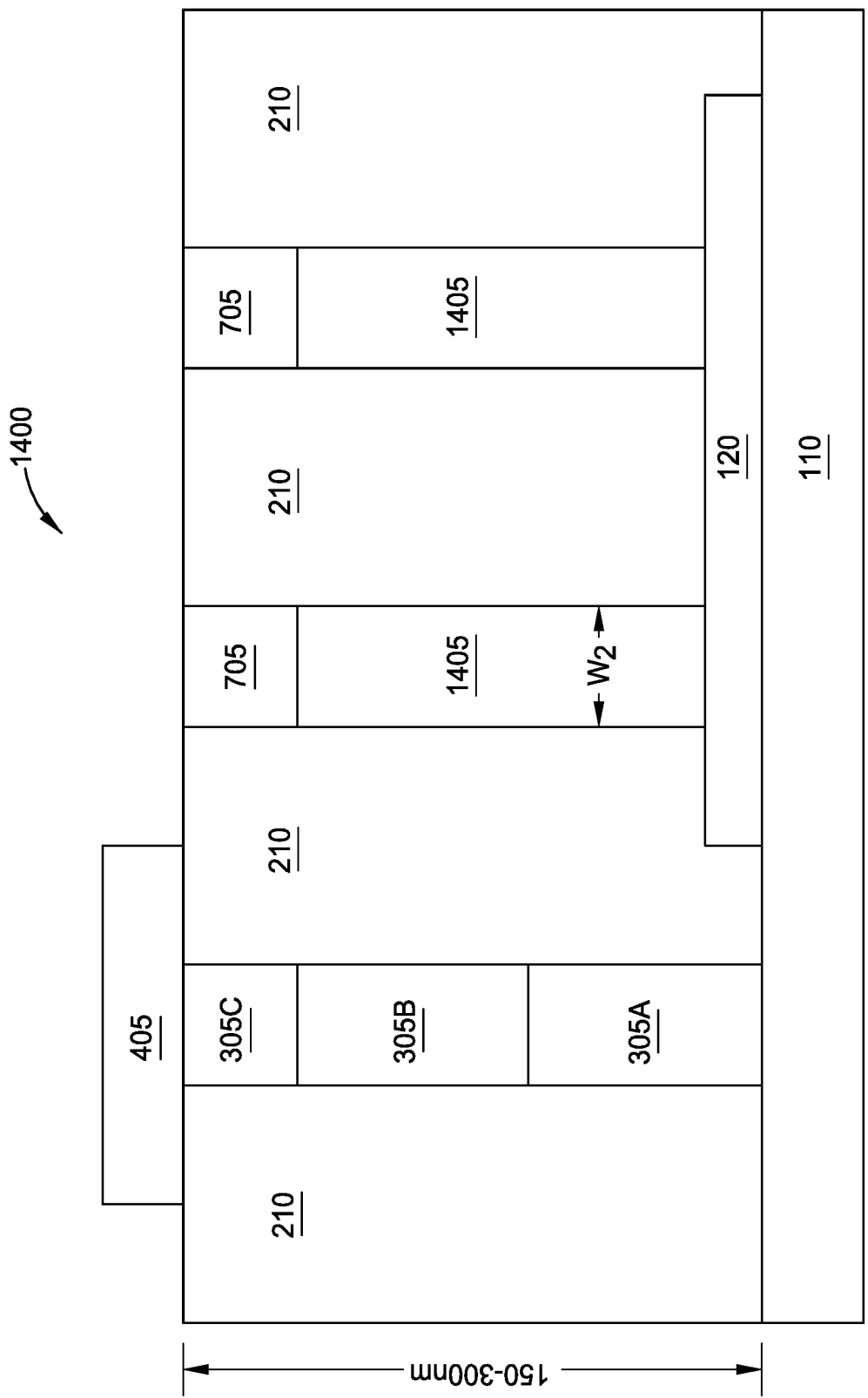

FIGS. 13 and 14 illustrate an embodiment for setting or adjusting a resistance value associated with a resistive material by adjusting or altering a dimensional characteristic associated therewith, resulting in structure 1300, 1400, respectively. According to at least one embodiment of the present disclosure, one or more of the dielectric layers 1305, e.g. an oxide layer 1305, are narrowed to accommodate a wider resistive material 1410. The narrowing of the dielectric layer 1305 can be performed by a directional etch technique, e.g. RIE, employed to one or more sidewalls associated with the dielectric layer 1305. The narrowed dielectric layer 1405 permits deposition of one or more wider resistive layer 1410 in accordance with one or more suitable deposition techniques as discussed herein or otherwise suitable for the task, and since resistance is partially a function of dimensional characteristics, depositing the widened resistive layer 1410 effectively determines the overall resistance value of the resistive layer 1410.

FIGS. 15-24 illustrate an alternative embodiment for forming resistive regions in ART trenches.

Figure 15:
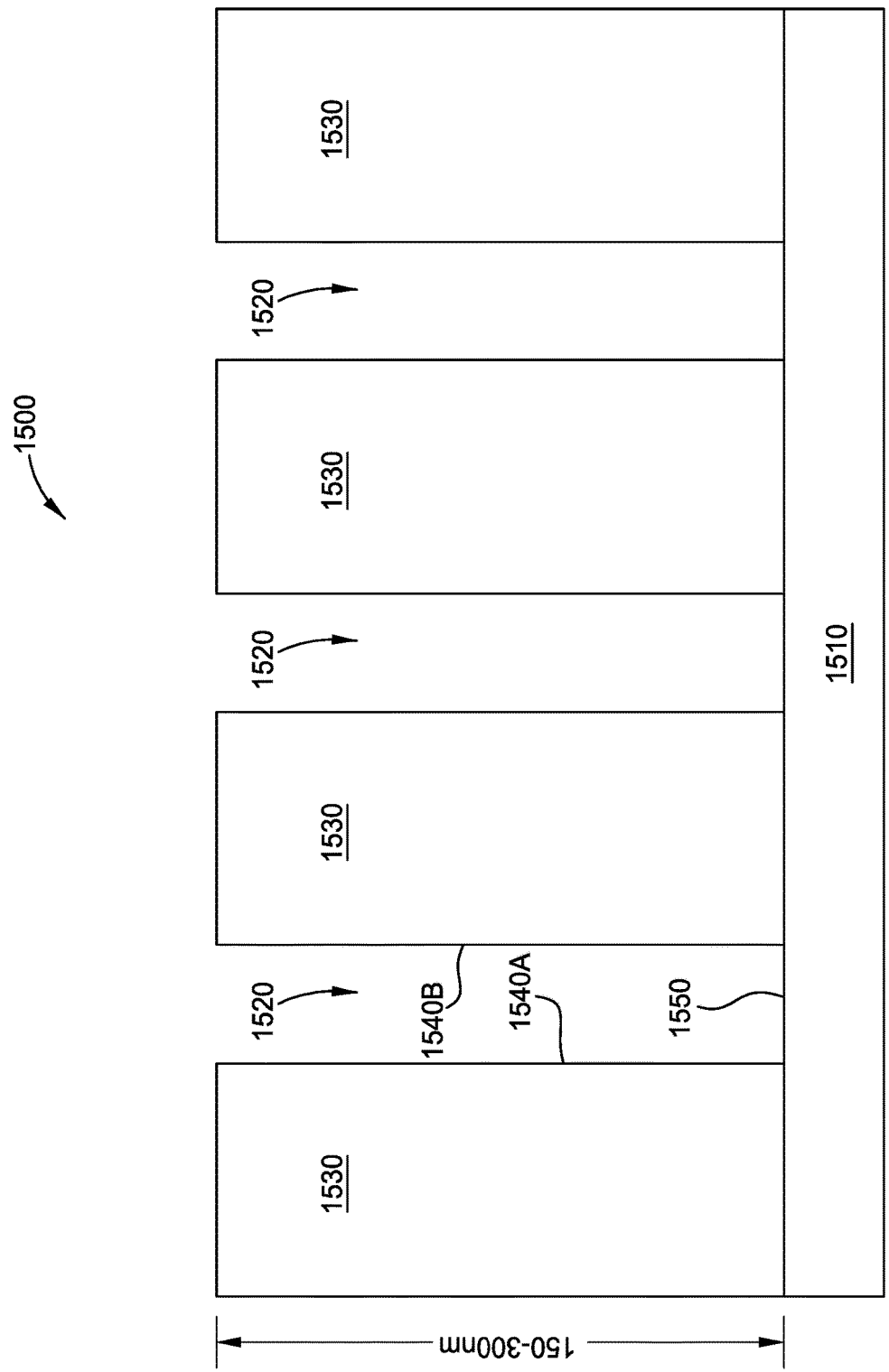
FIG. 15 is a cross-sectional view of an initial semiconductor structure that includes a substrate with a plurality of aspect ratio trapping structures formed thereon, which can be used in accordance with one or more embodiments of the present disclosure.

FIG. 15 is a cross-sectional view of an initial semiconductor structure 1500 that includes a substrate 1510 with a plurality of aspect ratio trapping structures 1530 formed thereon, which can be used in accordance with one or more embodiments of the present disclosure. The semiconductor substrate 1510 may be composed of a silicon containing material such as Si, single crystal Si, polycrystalline Si, SiGe, single crystal silicon germanium, and combinations and multi-layers thereof. The semiconductor substrate 1510 may also be composed of other semiconductor materials, such as germanium, and compound semiconductor substrates, such as type III/V (III-V) semiconductor substrates, including gallium arsenide (GaAs), indium phosphide (InP) and indium gallium arsenide (InGaAs), where in at least one embodiment the substrate is used, in accordance with aspect-ratio trapping techniques, to form one or more structures as disclosed herein. Although the semiconductor substrate 1510 is depicted as a bulk semiconductor substrate, semiconductor on insulator (SOI) substrate arrangements, such as silicon on insulator substrates, are also suitable for the semiconductor substrate 1510. The semiconductor structure 1500 includes a plurality of exposed ART trenches 1520. The ART trench 1520 is suitable for epitaxial deposition, including heteroepitaxial deposition, of a material stack 1610 (see FIG. 16) that includes one or more III-V materials, where in a general sense, the ART processes refers to any suitable practice and technique for confining defects, such as dislocation defects, that arise as a result of lattice-mismatches between material grown on a particular surface and the surface on which the growth takes place (for example, due to lattice-constant mismatches between the deposited material and the substrate material). Although not expressly shown, it is understood that an ART opening will be formed on the exposed surface of the substrate 1510, e.g., by selectively etching to the surface of the semiconductor substrate 1510. Any suitable ART process can be used to form the trench for depositing the III-V material stack 1610.

The semiconductor structure 1500 further includes one or more dielectric columns 1530 where the one or more dielectric columns 1530 form the basis for the ART process and also forms the basis for the ART trenches 1520. The dielectric columns 1530 have sidewalls 1540A, 1540B that define, along with bottom surface 1550 terminating on the substrate 1510 the trenches ART trenches 1520. The dielectric columns 1530 may have a height typically in the range of 310 nm to 300 nm. The dielectric columns 1530 may have a width typically in the range of 25 nm to 60 nm. The trenches ART trenches 1520 between the dielectric columns 1530 may have a width in the range of 8 nm to 20 nm.

The dielectric columns 1530 can be formed using know deposition techniques, e.g. (CVD), or variations thereof, followed by suitable photo-lithographic and masking techniques that are consistent with ART processes. In one embodiment, the substrate 1510 is a silicon based substrate 1510 and the dielectric columns 1530 are oxide dielectric columns 1530.

Figure 16:
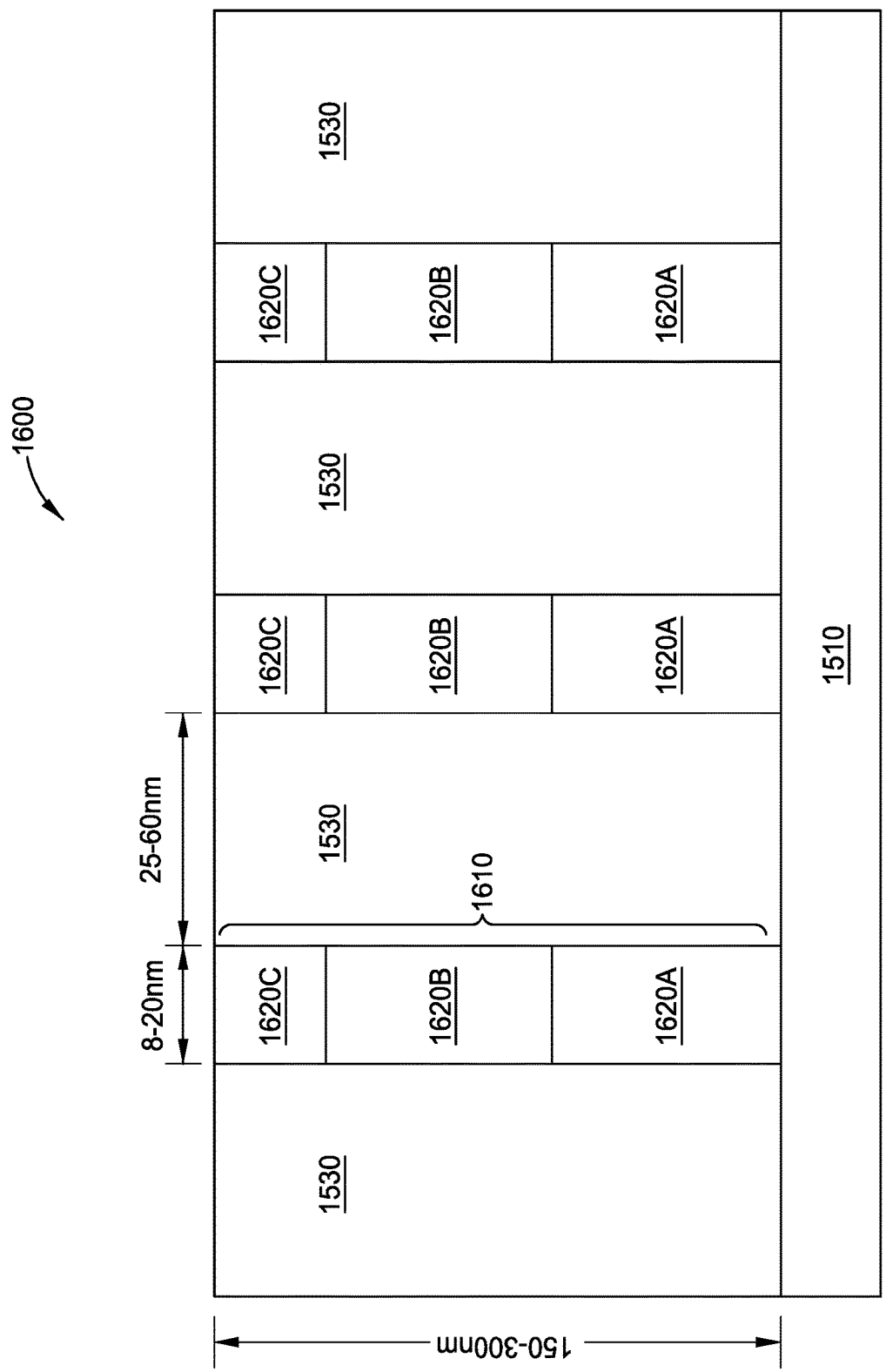
FIG. 16 is a cross-sectional side view of a semiconductor structure corresponding to the semiconductor structure of FIG. 15 after epitaxially growing at least one III-V material stack in the trench.

FIG. 16 is a cross-sectional side view of a semiconductor structure 1600 corresponding to the semiconductor structure 1500 of FIG. 15 after epitaxially growing at least one III-V material stack 1610 in the trench 1520. The epitaxial deposition can occur such that a heteroepitaxial region grows over the disposed silicon substrate 1510. The material stack 1610 includes a first region 1620A made of a first III-V semiconductor material forming the bottom layer of the stack 1610, a second region 1620B overlying the first region 1620A made of a second III-V material forming a middle layer of the material stack 1610, and a third region 1620C made of a third III-V material overlying the second region 1620B.

Exemplary III-V semiconductor materials that can be used for the regions 1620A, 1620B, 1620C the material stack 1610 include but are not limited to gallium arsenide (GaAs), indium phosphide (InP), and indium gallium arsenide (InGaAs). Various processes are familiar to those of skilled in the art for growing III-V semiconductor materials on silicon substrates. Such processes include metalorganic chemical vapor deposition (MOCVD) and molecular beam epitaxy (MBE). Many different III-V compounds could be grown on the substrate 1510 using multiple different precursors. Depending on which III-V material(s) is to be grown and which precursor is used, different parameters (temperature, process pressure, times, etc.) are applicable. Non-limiting examples of metalorganic prescursors include Trimethylgallium, Trimethylaluminum, Trimethylindium, Trimethylantimony, Tertiarybutylarsine and Tertiarybutylphosphine. Alternate Group V precursors include arsine and phosphine. In one embodiment, the material stack 1610 includes at least one of indium gallium arsenide (InGaAs) and indium-phosphide (InP). Depending on which Group V source is used, process temperature, gas flow, pressure and times can vary significantly in accordance with aspect-ratio trapping techniques know in the art or separately described herein. In one embodiment, as shown, the epitaxial process is adjusted such that more than one III-V material 1620A, 1620B, and 1620C constitutes the material stack 1610, where first region 1620A is a GaAs layer, second region 1620B is an InP layer, and third region 1620C is an InGaAs layer.

Figure 17:
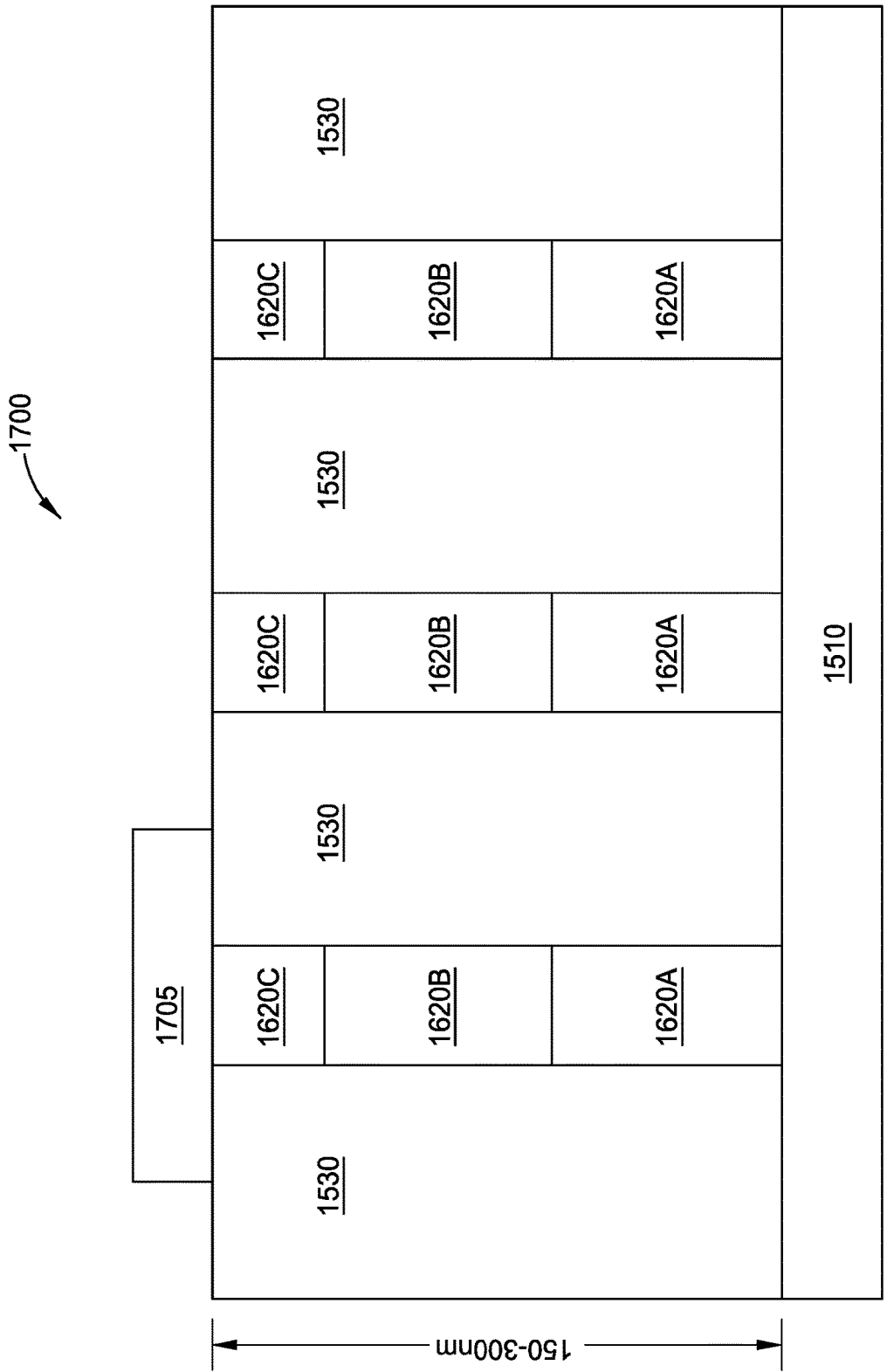
FIG. 17 is a cross-sectional side view of a semiconductor structure corresponding to the semiconductor structure of FIG. 16 after depositing a hard mask over one or more of the III-V material stack to be preserved for forming transistor devices.

FIG. 17 is a cross-sectional side view of a semiconductor structure 1700 corresponding to the semiconductor structure 1600 of FIG. 16 after depositing a hard mask 1705 over one or more of the III-V material stack 1610 to be preserved for forming transistor devices. The hard mask 1705 can be a nitride, oxide, or other suitable material.

Figure 18:
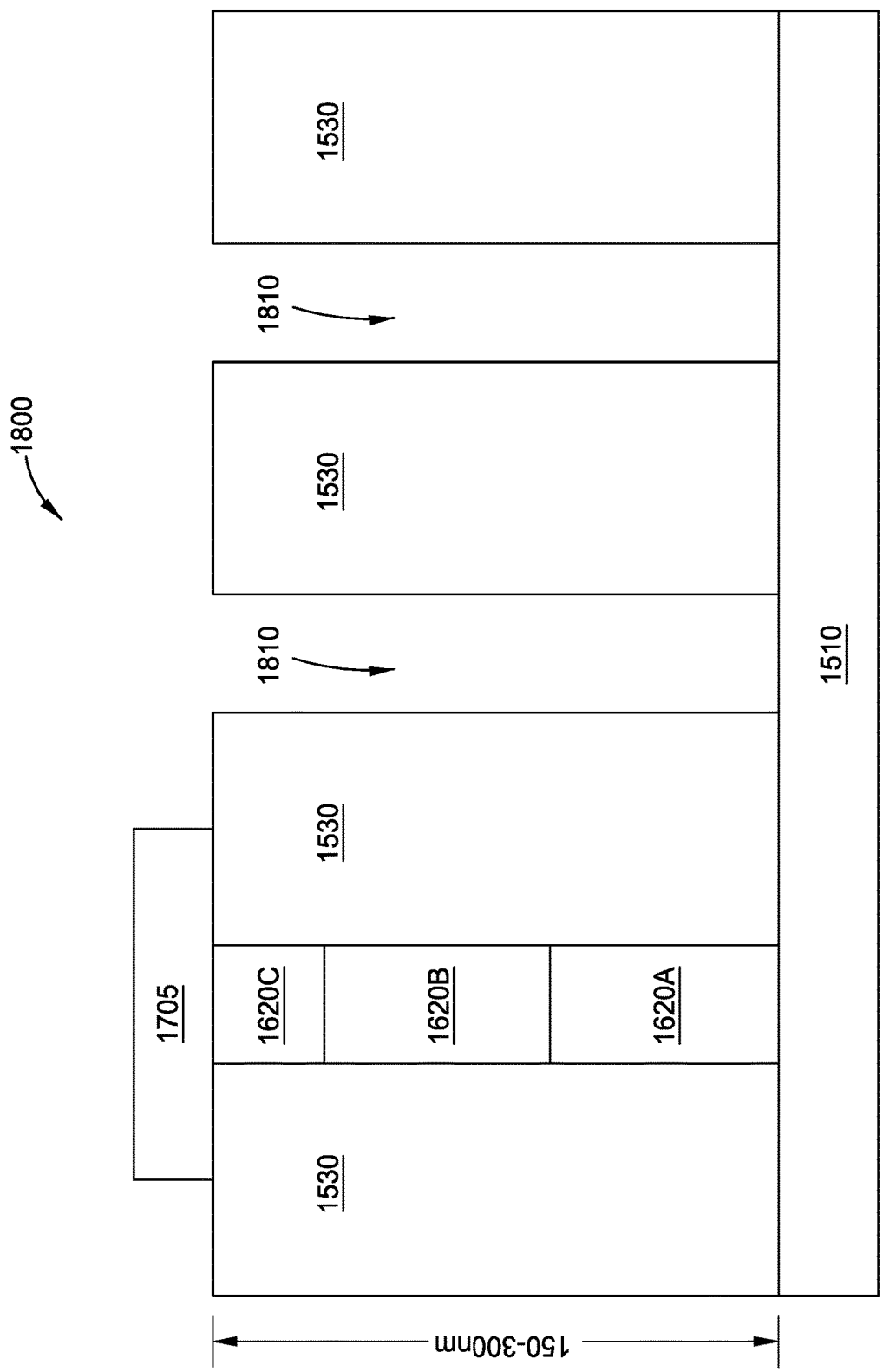
FIG. 18 is a cross-sectional side view of a semiconductor structure corresponding to the semiconductor structure of FIG. 17 after etching at least one of the one or more of the III-V material stack in at least one of the one or more ART trenches to form exposed trenches. The formation of the exposed trenches can be accomplished using any suitable etching technique, including but not limited to RIE.

FIG. 18 is a cross-sectional side view of a semiconductor structure 1800 corresponding to the semiconductor structure 1700 of FIG. 17 after etching at least one of the one or more of the III-V material stack 1610 in at least one of the one or more ART trenches 1520 to form exposed trenches 1810. The formation of the exposed trenches 1810 can be accomplished using any suitable etching technique, including but not limited to RIE.

Figure 19:
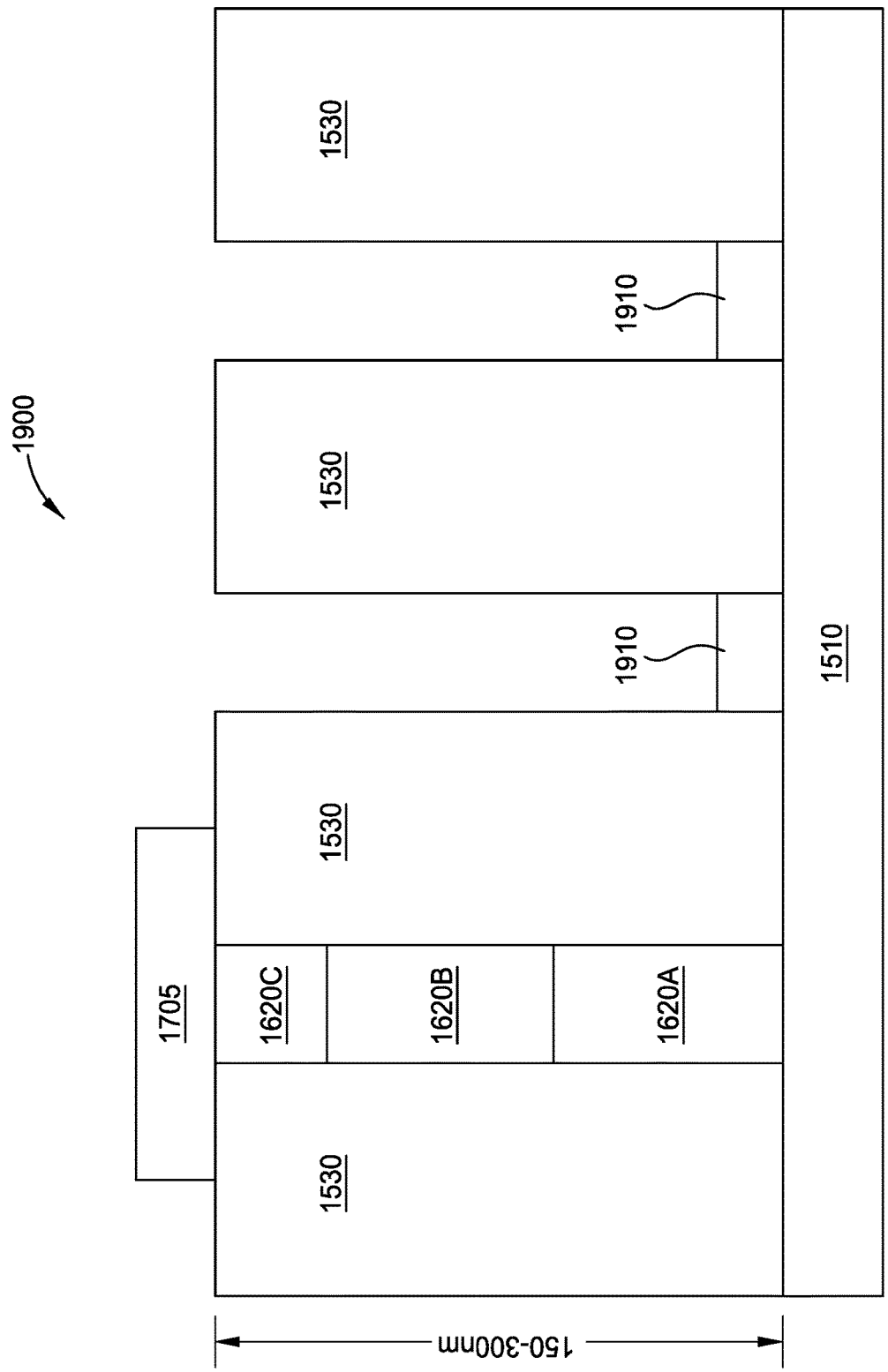
FIG. 19 is a cross-sectional side view of a semiconductor structure corresponding to the semiconductor structure of FIG. 18 after forming insulator regions in each of the exposed trenches.

FIG. 19 is a cross-sectional side view of a semiconductor structure 1900 corresponding to the semiconductor structure 1800 of FIG. 18 after forming insulator regions 1910 in each of the exposed trenches 1810. The insulator regions may be an oxide, such as silicon dioxide, formed by applying a plasma oxidation process followed by an ozone oxidation process on the exposed silicon substrate 1510 of the exposed trenches 1810.

Figure 20:
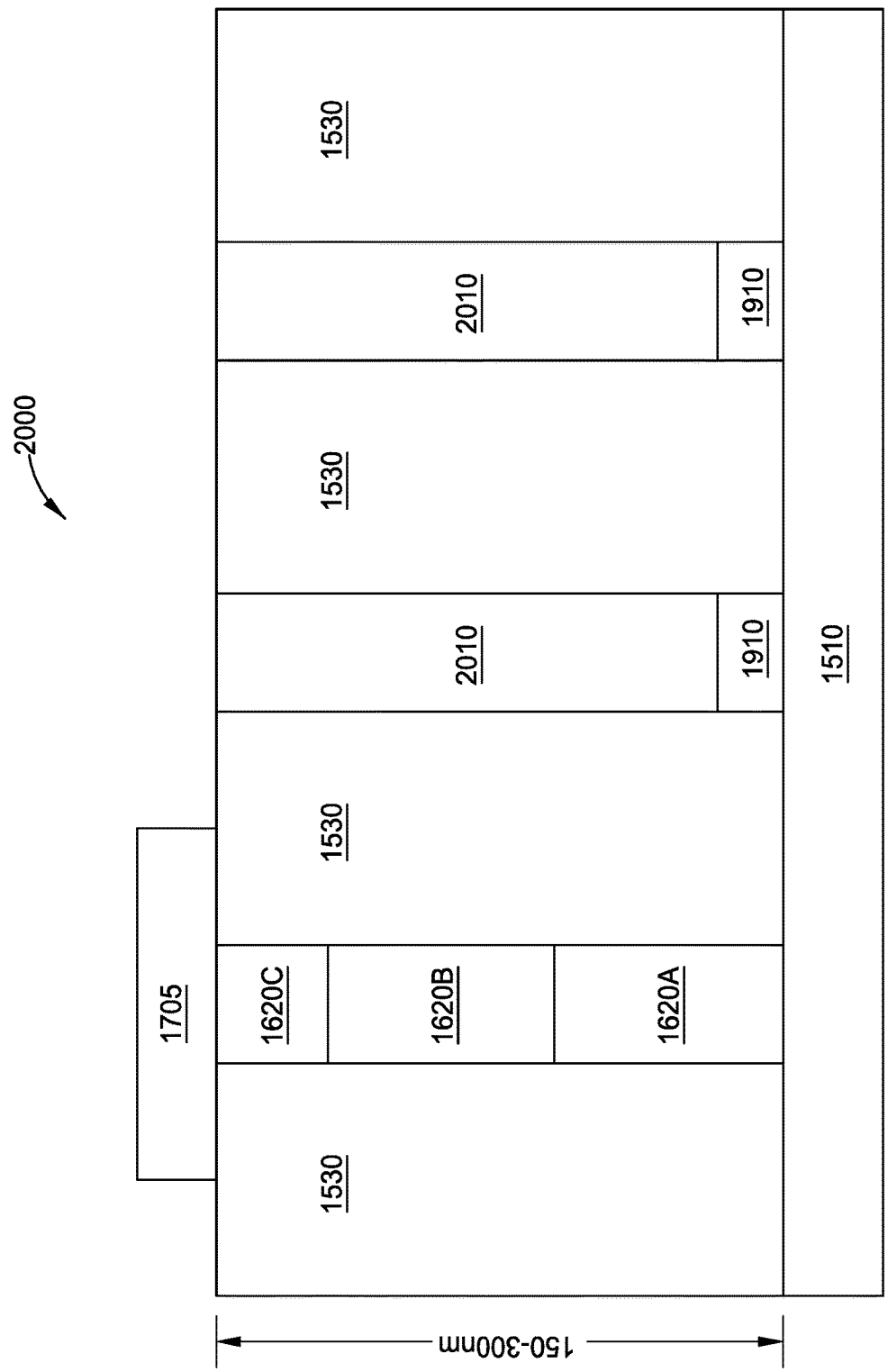
FIG. 20 is a cross-sectional side view of a semiconductor structure corresponding to the semiconductor structure of FIG. 19 after depositing at least one resistive material in one or more of the exposed trenches to form one or more resistive regions.

FIG. 20 is a cross-sectional side view of a semiconductor structure 2000 corresponding to the semiconductor structure 1900 of FIG. 19 after depositing at least one resistive material in one or more of the exposed trenches 1810 to form one or more resistive regions 2010. Using any suitable deposition technique, including CVD, e.g. PECVD, the exposed trenches 1810 are filled with one or more resistive materials including but not limited to doped poly silicon (poly-Si), tantalum nitride, (TaN), titanium nitride (TiN), alloyed titanium nitride, titanium silicon nitride (TiSiN), tungsten nitride (WN),), titanium carbide (TiC), tantalum carbide (TaC), tungsten carbide (WC), hafnium carbide (HfC), hafnium nitride (HfN), titanium aluminum carbide (TiAlC), or combinations thereof. The oxide insulator regions 1910 insulates the one or more resistive regions 2010 from other portions of structure 2000.

Figure 21:
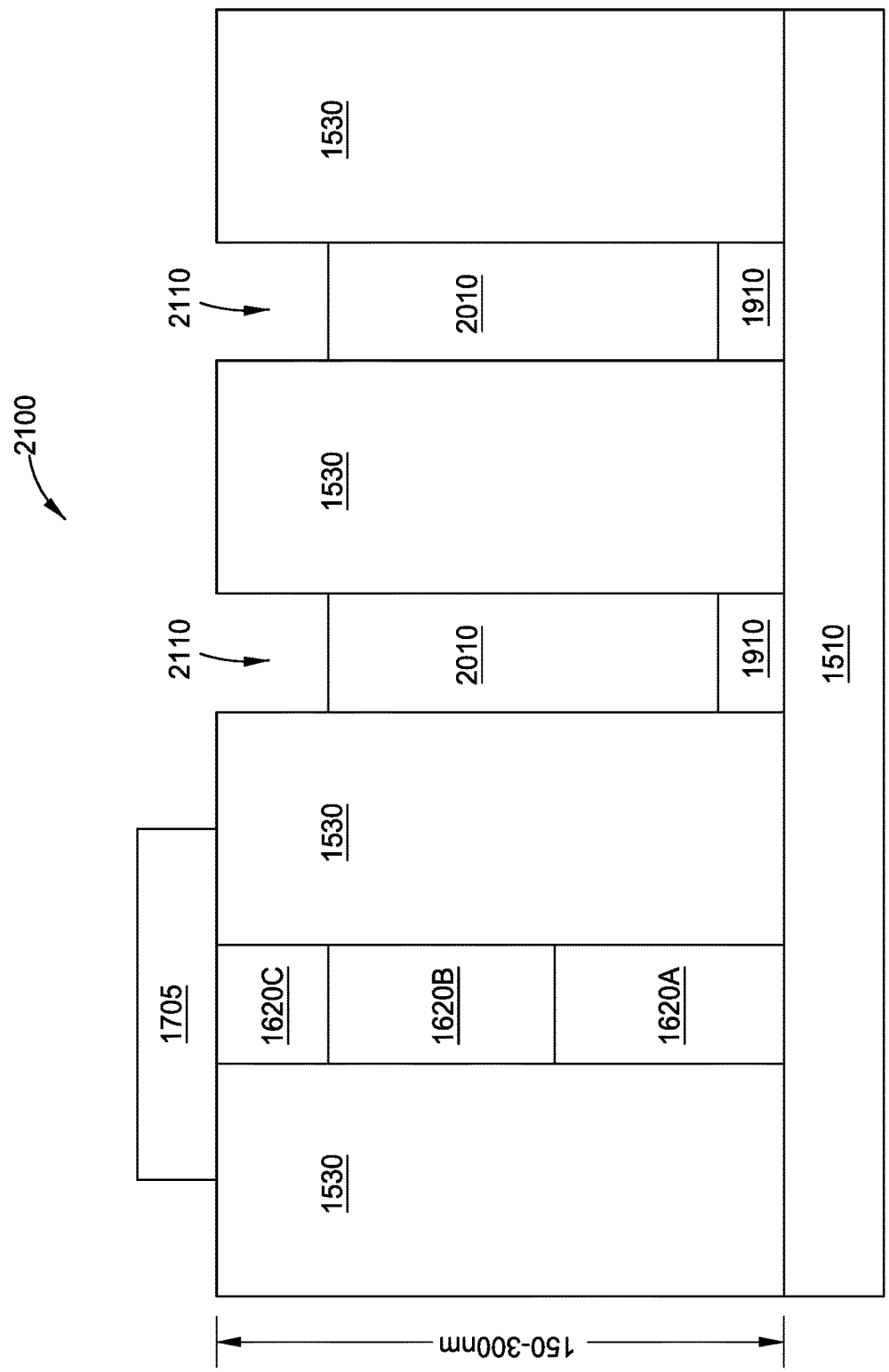
FIG. 21 is a cross-sectional side view of a semiconductor structure corresponding to the semiconductor structure of FIG. 20 after recessing a portion of one or more of the resistive regions.

FIG. 21 is a cross-sectional side view of a semiconductor structure 2100 corresponding to the semiconductor structure 2000 of FIG. 20 after recessing a portion 2110 of one or more of the resistive regions 2010. The recessing can be accomplished using any suitable etching technique, including but not limited to RIE.

Figure 22:
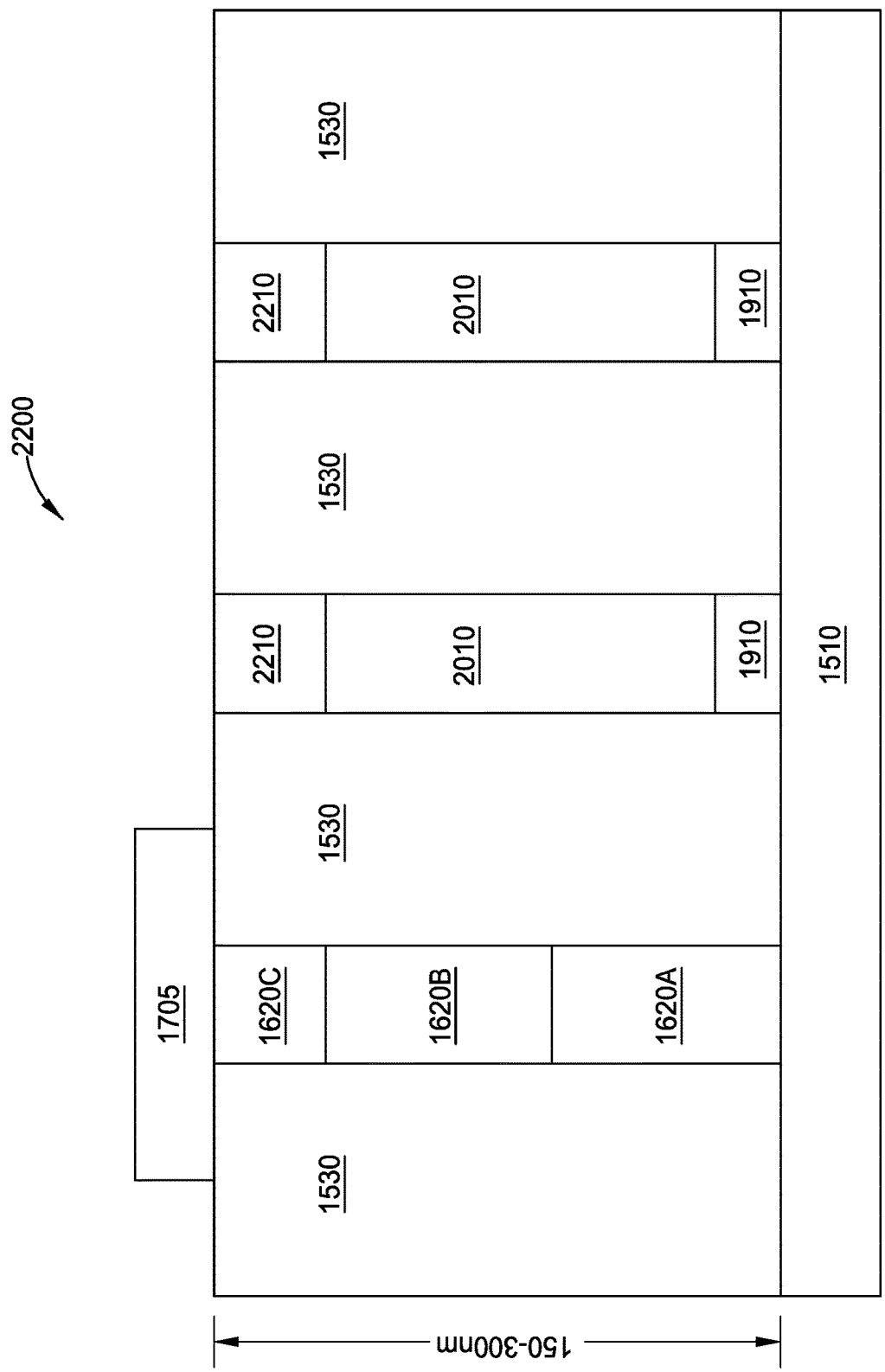
FIG. 22 is a cross-sectional side view of a semiconductor structure corresponding to the semiconductor structure of FIG. 21 after depositing an insulator material over the one or more resistive regions.

FIG. 22 is a cross-sectional side view of a semiconductor structure 2200 corresponding to the semiconductor structure 2100 of FIG. 21 after depositing an insulator material 2205 over the one or more resistive regions 2010. The insulator material 2210 may be deposited using any suitable deposition technique, e.g. CVD. In one embodiment, the insulator material 2210 is an oxide based material.

Figure 23:
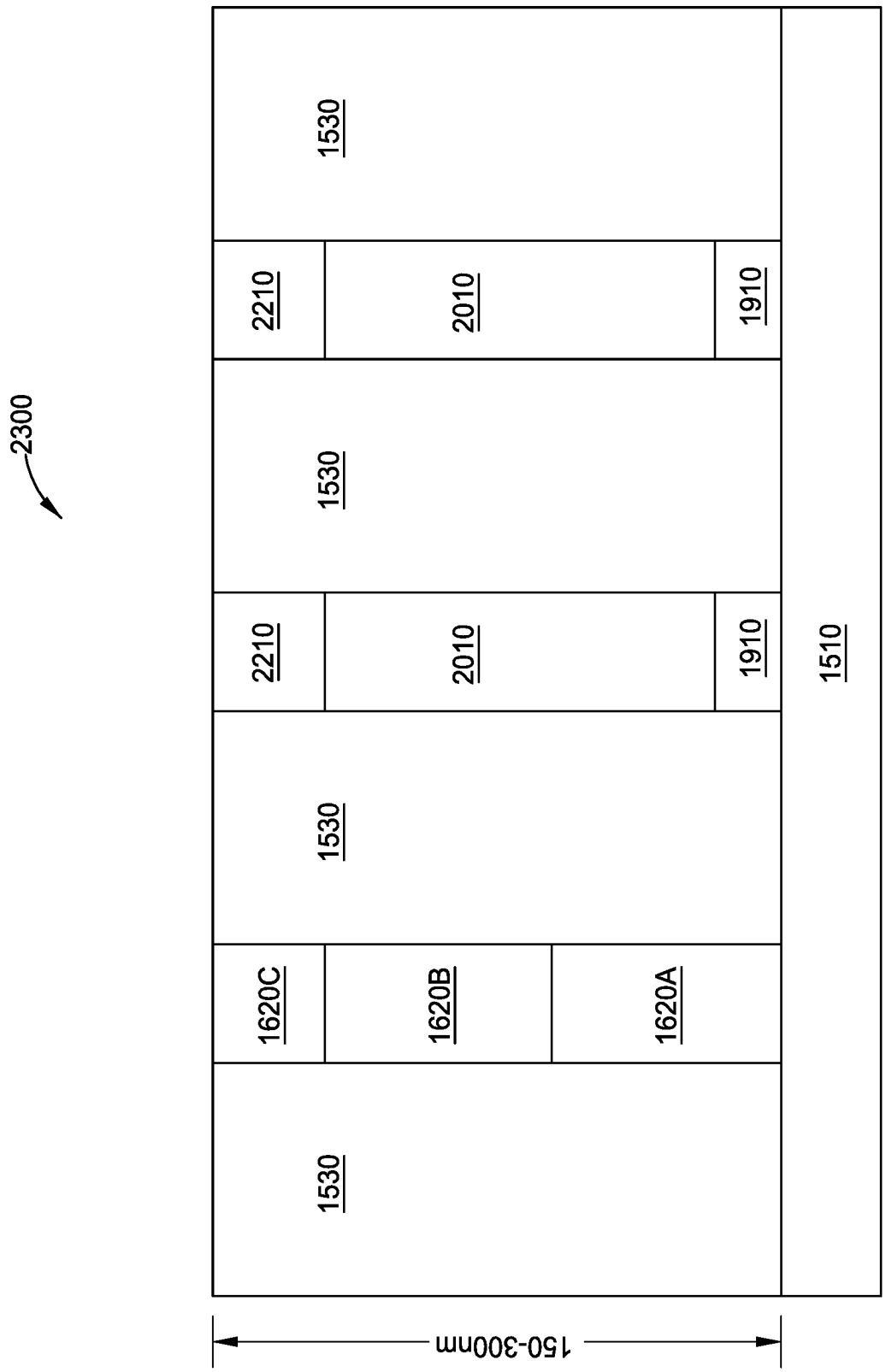
FIG. 23 is a cross-sectional side view of a semiconductor structure corresponding to the semiconductor structure of FIG. 22 after removing the hard mask.

FIG. 23 is a cross-sectional side view of a semiconductor structure 2300 corresponding to the semiconductor structure 2200 of FIG. 22 after removing the hard mask 1705. The hard mask 1705 may be removed using a suitable etching technique selective to the material that makes up the hard mask 1705, e.g. nitride, including but not limited to RIE.

Figure 24:
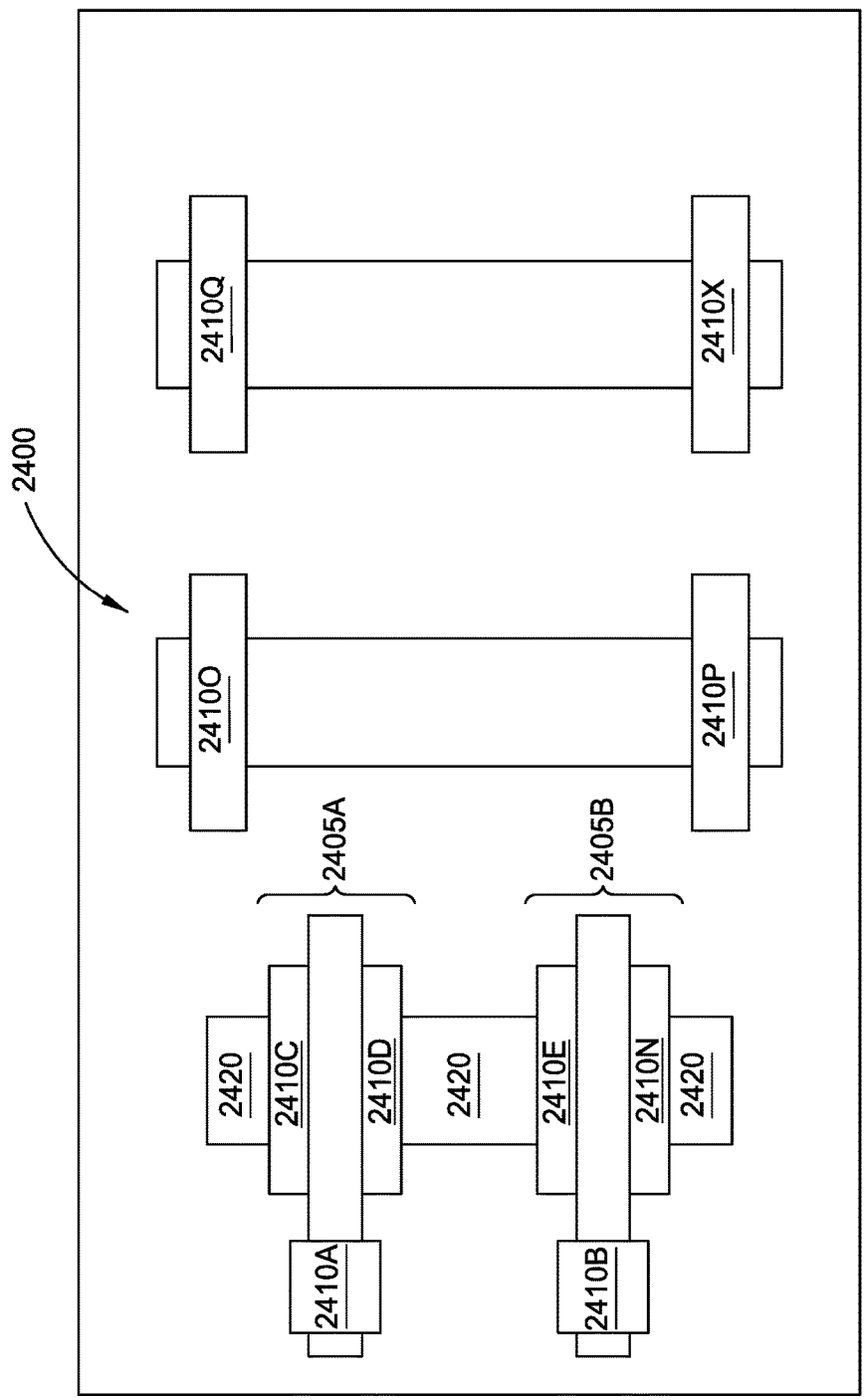
FIG. 24 is a top down view of a semiconductor structure corresponding to the semiconductor structure of FIG. 23 after forming a plurality of III-V compound semiconductor transistor devices overlying the material stacks.

FIG. 24 is a top down view of a semiconductor structure 2400 corresponding to the semiconductor structure 2300 of FIG. 23 after forming a plurality of III-V compound semiconductor transistor devices 2405A, 2405B overlying the material stacks 1610 in each of the unexposed trenches and forming contacts 2410A-2410N to individual sections of the devices 2405A, 2405B, as well as forming contacts 24100-2410X overlying the one or more of the resistive regions 2010 underlying the insulator material 2205. The transistor devices 2405A, 2405B can include gate structures 2415 having gate contacts 2410A, 2410B formed thereon. The transistor devices 2405A, 2405B can further include gate source/drain regions (not shown) having source/drain contacts (S/D) 2410C-2410N formed thereon. The transistor devices 2405A, 2405B are separated from each other by shallow trench insolation (STI) regions 2420.

The value of the resistance of the resistive regions 2010 can be determined by several parameter including the height of the resistive region 2010, the width of the resistive regions 2010, the composition of the resistive material itself, the spacing of the contacts 24100-2410X overlying the resistive regions 2010, and the number of resistive regions 2010 spanned by single contacts.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A method for forming a semiconductor structure comprising:
providing a substrate with an insulator pad overlying at least a top portion of the substrate;
forming a plurality of dielectric columns overlying at least one of the substrate and the insulator pad, wherein each dielectric column is separated from another dielectric column to form a corresponding plurality of aspect ratio trapping (ART) trenches, wherein the insulator pad forms a bottom portion of a first ART trench of the plurality of ART trenches, and wherein a portion of the substrate forms a bottom portion of a second ART trench of the plurality of ART trenches;
forming a III-V semiconductor material stack in the second ART trench; and
forming a first resistive region in the first ART trench, wherein the first resistive region is in contact with the insulator pad.

2. The method of claim 1, wherein forming the first resistive region comprises depositing a resistive material in the first ART trench over the insulator pad.

3. The method of claim 1, wherein forming the III-V semiconductor material stack comprises epitaxially growing the III-V semiconductor material stack in the second ART trench.

4. The method of claim 1, further comprising:
depositing a hard mask over the III-V semiconductor material stack; and
removing residual material associated with an epitaxial growth in the first ART trench overlying the insulator pad.

5. The method of claim 1 further comprising:
recessing the resistive region such that an exposed top surface of the resistive region is below a top surface of adjoining dielectric columns that form the first ART trench.

6. The method of claim 5, further comprising:
depositing an oxide material over the recessed resistive region.

7. The method of claim 1, further comprising:
depositing a hard mask over the III-V semiconductor material stack;
removing residual material associated with an epitaxial growth in the plurality of openings over the insulator pad, wherein the insulator pad is a nitride pad;
depositing the resistive region in the first ART trench;
recessing the resistive region such that an exposed top surface of the resistive region is below a top surface of adjoining dielectric columns that form the first ART trench;
depositing an oxide material over the recessed resistive region; and
removing the hard mask over the III-V material stack.

8. The method of claim 1, further comprising forming a III-V transistor structure overlying the III-V semiconductor material stack.

9. The method of claim 8, further comprising forming a second resistive region in a third ART trench of the plurality of ART trenches, wherein the first resistive region and the second resistive region differ according to at least one parameter that varies resistance.

10. The method of claim 9, further comprising forming at least two metal contacts on each of the first resistive region and the second resistive region, wherein a separation distance between the two metal contacts determines the resistance values, respectively, of the first resistive region and the second resistive region.

11. A method for forming a semiconductor structure comprising:
providing a substrate;
forming a plurality of dielectric columns overlying the substrate, wherein each dielectric column is separated from another dielectric column to form a corresponding plurality of aspect ratio trapping (ART) trenches;
forming a III-V semiconductor material stack in each of the plurality of ART trenches;
removing at least one III-V semiconductor material stack from at least one of the plurality of ART trenches to form an exposed ART trench;
forming an oxide layer overlying the substrate in the exposed ART trench; and
forming a first resistive region in the exposed ART trench, wherein the first resistive region is in contact with the oxide layer.

12. The method of claim 11, further comprising:
recessing the first resistive region such that an exposed top surface of the first resistive region is below a top surface of adjoining dielectric columns that form the exposed ART trench.

13. The method of claim 12, further comprising:
depositing an oxide material over the recessed resistive region.

14. The method of claim 11, further comprising forming a III-V transistor structure overlying the III-V semiconductor material stack.

15. The method of claim 11, further comprising:
forming a second resistive region in a second exposed ART trench of the plurality of ART trenches, wherein the first resistive region and the second resistive region differ according to at least one parameter that varies resistance.

16. The method of claim 15, further comprising forming at least two metal contacts on each of the first resistive region and the second resistive region, wherein a separation distance between the two metal contacts determines the resistance values, respectively, of the first resistive region and the second resistive region.

17. A semiconductor structure comprising:
a substrate;
an insulator pad formed overlying at least a portion of the substrate;
a plurality of dielectric columns formed overlying the substrate and the insulator pad, wherein each dielectric column is separated from another dielectric column to form a corresponding plurality of aspect ratio trapping (ART) trenches, wherein the insulator pad forms a bottom portion of a first ART trench of the plurality of ART trenches, and wherein a portion of the substrate forms a bottom portion of a second ART trench of the plurality of ART trenches;
a III-V semiconductor material stack formed in the second ART trench; and
a first resistive region formed in the first ART trench, wherein the first resistive region is in contact with the insulator pad.

18. The semiconductor structure of claim 17, wherein the insulator pad is a nitride pad formed on a top portion of the substrate.

19. The semiconductor structure of claim 17, wherein the insulator pad is a nitride pad buried within a top portion of the substrate.

20. The semiconductor structure according to claim 17, further comprising:
an oxide layer over the resistive region.

21. The semiconductor structure of claim 17, further comprising a III-V transistor structure formed overlying the III-V semiconductor material stack.

22. The semiconductor structure of claim 17, further comprising:
a second resistive region formed in a third ART trench of the plurality of ART trenches, wherein the first resistive region and the second resistive region differ according to at least one parameter that varies resistance.

23. The semiconductor structure of claim 22, wherein the at least one parameter is one or more of a height of the first resistive region relative to the second resistive region, a width of the first resistive region relative to the second resistive region, or a composition of the first resistive region relative to the second resistive region.

24. The semiconductor structure of claim 22, wherein at least two metal contacts are formed on each of the first resistive region and the second resistive region, wherein a separation distance between the two metal contacts determines the resistance values, respectively, of the first resistive region and the second resistive region.

25. The semiconductor structure of claim 17, further comprising a plurality of resistive regions formed in the plurality of ART trenches, wherein contacts are formed on two or more of the plurality of resistive regions to form a resistive network.

* * * * *